(12) United States Patent
Sekiya

(10) Patent No.: US 7,598,518 B2
(45) Date of Patent: Oct. 6, 2009

(54) ORGANIC TRANSISTOR WITH LIGHT EMISSION, ORGANIC TRANSISTOR UNIT AND DISPLAY DEVICE INCORPORATING THE ORGANIC TRANSISTOR

(75) Inventor: Takuro Sekiya, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 500 days.

(21) Appl. No.: 11/369,058

(22) Filed: Mar. 7, 2006

(65) Prior Publication Data
US 2006/0208962 A1 Sep. 21, 2006

(30) Foreign Application Priority Data

| Mar. 7, 2005 | (JP) | ............................. 2005-063197 |
| Mar. 7, 2005 | (JP) | ............................. 2005-063198 |
| Mar. 7, 2005 | (JP) | ............................. 2005-063199 |
| Mar. 7, 2005 | (JP) | ............................. 2005-063200 |
| Mar. 7, 2005 | (JP) | ............................. 2005-063201 |

(51) Int. Cl.
*H01L 51/52* (2006.01)

(52) U.S. Cl. .................................... 257/40; 315/169.1

(58) Field of Classification Search .................. 257/40; 315/169.1
See application file for complete search history.

(56) References Cited

U.S. PATENT DOCUMENTS

| 3,298,030 | A | 1/1967 | Lewis et al. |
| 3,596,275 | A | 7/1971 | Sweet |
| 3,683,212 | A | 8/1972 | Zoltan |
| 3,747,120 | A | 7/1973 | Stemme |
| 3,946,398 | A | 3/1976 | Kyser et al. |
| 6,215,538 | B1 * | 4/2001 | Narutaki et al. ............. 349/106 |
| 6,918,666 | B2 | 7/2005 | Sekiya |
| 6,975,663 | B2 | 12/2005 | Sekiya et al. |
| 2001/0002703 | A1 * | 6/2001 | Koyama ...................... 257/40 |
| 2004/0150320 | A1 | 8/2004 | Sekeya |
| 2004/0164667 | A1 * | 8/2004 | Dedene et al. ............. 313/500 |
| 2004/0201648 | A1 | 10/2004 | Sekiya |
| 2005/0140709 | A1 | 6/2005 | Sekiya |
| 2005/0147743 | A1 | 7/2005 | Sekiya |

FOREIGN PATENT DOCUMENTS

JP 54-51837 4/1979

(Continued)

OTHER PUBLICATIONS

Oyamada et al. "Lateral organic light-emitting diode with field-effect transistor characteristics", J. App. Phys. 98, 074506 (Oct. 2005).*

(Continued)

*Primary Examiner*—Thomas L Dickey
(74) *Attorney, Agent, or Firm*—Oblon, Spivak, McClelland, Maier & Neustadt, L.L.P.

(57) ABSTRACT

An organic transistor includes: a substrate made of electrically conductive material or semiconductor material; an insulating layer on the substrate; and an organic semiconductor layer and a pair of electrodes on the insulating layer, wherein a configuration is made such that: the organic semiconductor layer is sealed by a translucent member; a voltage is applied between the pair of electrodes in a range such that the organic semiconductor layer emits light; further a voltage is applied to the substrate so as to control the light emission of the organic semiconductor layer; and light emitted by the organic semiconductor layer can be taken out via the translucent member.

13 Claims, 23 Drawing Sheets

FOREIGN PATENT DOCUMENTS

| | | |
|---|---|---|
| JP | 10-190001 | 7/1998 |
| JP | 2004-18831 | 1/2004 |

OTHER PUBLICATIONS

Hepp et al. "Light-Emitting Field-Effect Transistor Based on a Tetracene Thin Film", Phys. Rev. Lett. 91, 157406 (2003).*

Sakanoue et al. "Preparation of Organic Light-emitting Field-effect Transistors with Asymmetric Electrodes", Chem. Lett. (Japan) 34, 494 (Mar. 5, 2005).*

Rost et al. "Ambipolar light-emitting organic field-effect transistor" App. Phys. Lett. 85, 1613 (2004).*

Ahles et al. "Light emission from a polymer transistor" App. Phys. Lett. 84, 428 (2004).*

Takahito Oyamada, et al., "Electroluminescence from field effect transistors with TPTPT as an active layer and the channel length dependence", Extended Abstracts (The 65$^{th}$ Autumn Meeting, 2004); The Japan Society of Applied Physics, 2a-ZR-2, p. 1163, (with English translation).

Hiroyuki Uchiuzou, et al., "Ambipolar characteristics of the co-deposited film of low-molecular materials and the realization of light-emitting transistors", Extended Abstracts (The 65th Autumn Meeting, 2004); The Japan Society of Applied Physics, 2a-ZR-3, p. 1163, (with English translation).

Christos D. Dimitrakopoulos, et al. "Organic Thin Film Transistors for Large Area Electronics", Advanced Materials, vol. 14, No. 2, Jan. 16, 2002, pp. 99-117.

Wonsuk Chung, et al. "6.4: Crystallization of Ultra-low Temperature ITO by XeCl Excimer Laser Annealing", SID 02 Digest, 2002, pp. 57-59.

* cited by examiner (a) (b) (c)

FLYING DIRECTION

FLYING DIRECTION

FLYING DIRECTION

ORGANIC TRANSISTOR WITH LIGHT EMISSION, ORGANIC TRANSISTOR UNIT AND DISPLAY DEVICE INCORPORATING THE ORGANIC TRANSISTOR

BACKGROUND OF THE INVENTION

1. Field of the Invention

The present invention relates to an organic transistor and associates, and, in particular, to an organic thin-film transistor having light emission function, as well as a display device employing it.

2. Description of the Related Art

Along with a spread of each type of information terminal unit, an improvement of performance and a variety of the devices are demanded. Specifically, needs for a flat panel display device as a display device for a computer has been increasing. Further, along with a development of information society, occasions of providing information in an electronic form instead of a form of paper has been increasing. Thereby, needs for an electronic paper or a digital paper as a mobile display medium which is thin and has a light weight, so that it is easier for carrying, are increasing.

Generally speaking, a display medium employing a device of liquid crystal, organic EL, electrophoretic effect or such, is provided in a flat-type display device. In such a display medium, in order to ensure uniformity of screen brightness and/or screen rewriting speed, an art of using an active driving device made of a thin-film transistor (TFT) is mainly employed for the image driving device. The TFT device is produced as a result of, commonly, on a glass substrate, mainly a semiconductor thin-film such as that of a-Si (amorphous silicon), p-Si (polysilicon) or such, a metal thin-film for a source, a drain and a gate electrodes, and so forth, being laminated in sequence. For producing a flat-panel display device employing the TFT device, commonly, in addition to a thin-film producing process employing a vacuum equipment for CVD, spattering or such, a high-temperature processing process and so forth, a photolithographic process requiring a high accuracy, are required. Therefore, equipment costs and running costs may become very high. Further, along with recent needs for an increase in a size of the display screen, a cost increasing rate along with manufacturing it has becomes very high.

Recently, research and development of an organic TFT device employing an organic semiconductor material is proceeded with (see Japanese Laid-open Patent Application No. 10-190001 and the Advanced Materials journal, 2002, No. 2, page 99 (review)). According to SID, '02 Digest, page 57, since the organic TFT device can be produced in a low temperature process, a resin substrate which has a light weight and is hard to be broken, can be employed instead of a glass substrate which has a heavy weight and is easy to be broken. Further, according to the same document, a flexible display device employing a resin film as a supporting body will be realized. Further, as a result of employing an organic semiconductor material which can be produced in a wet process such as printing, coating or such under an atmospheric pressure being employed, a display device of a very reduced cost with a superior productivity can be realized.

On the other hand, as part of research result of such an organic TFT device employing organic semiconductor material, a light emitting type transistor is reported (see Extended Abstracts (The 65th Autumn Meeting, 2004), Japan Society of Applied Physics, page 1163). By using it, a display device having a new configuration in which a display medium and an image driving device can be integrated, may be realized.

SUMMARY OF THE INVENTION

However, this research is in an initial stage in which a light emitting phenomenon has been confirmed. Further research is required for a specific scenario as to how to produce a display device applying this art. The present invention has been devised in consideration of such a situation.

A first object of a first aspect of the present invention is to propose an organic light-emitting transistor having new configuration and function.

A second object of the first aspect of the present invention is to propose new configurations by which such a display device can be stably operated.

A third aspect of the first aspect of the present invention is to propose a display device employing the organic light-emitting transistor.

A first organic transistor includes: a substrate made of electrically conductive material or semiconductor material; an insulating layer on the substrate; and an organic semiconductor layer and a pair of electrodes on the insulating layer, wherein a configuration is made such that: the organic semiconductor layer is sealed by a translucent member; a voltage is applied between the pair of electrodes in a range such that the organic semiconductor layer emits light; further a voltage is applied to the substrate so as to control the light emission of the organic semiconductor layer; and light emitted by the organic semiconductor layer can be taken out via the translucent member.

As a result, an organic light-emitting transistor having a new configuration by which transistor operation and light-emitting operation can be carried out in a single device can be proposed.

A second organic transistor includes a substrate; a pair of electrodes including a first electrode and a second electrode; an organic semiconductor layer provided between the first and second electrodes; and a third electrode, through an insulating layer, in an area in which the organic semiconductor layer is provided between the pair of electrodes, wherein: a configuration is made such that: a voltage is applied between the pair of electrodes in a range such that the organic semiconductor layer emits light; further a voltage is applied to the third electrode so as to control the light emission of the organic semiconductor layer; and the substrate is made of translucent material so that light emitted by the organic semiconductor layer can be taken out from a side of the substrate.

As a result, an organic light-emitting transistor having another new configuration by which transistor operation and light-emitting operation can be carried out in a single device can be proposed.

A third organic transistor includes: a substrate; a pair of electrodes including a first electrode and a second electrode; an organic semiconductor layer provided between the first and second electrodes; and a third electrode, through an insulating layer, in an area in which the organic semiconductor layer is provided between the pair of electrodes, wherein: a configuration is made such that: a voltage is applied between the pair of electrodes in a range such that the organic semiconductor layer emits light; further a voltage is applied to the third electrode so as to control the light emission of the organic semiconductor layer; and the insulating layer and the third electrode are made of translucent material so that light emitted by the organic semiconductor layer can be taken out from a side of the third electrode.

As a result, an organic light-emitting transistor having another new configuration by which transistor operation and light-emitting operation can be carried out in a single device can be proposed.

A fourth organic transistor is configured such that: an electrode layer, an insulating layer and an organic semiconductor layer are produced on a substrate in the stated order; and a pair of electrodes are produced to be electrically conductive to the organic semiconductor layer, wherein a configuration is further made such that: the organic semiconductor layer is sealed; a voltage is applied between the pair of electrodes in such a range that the organic semiconductor layer emits light; a voltage is further applied to the electrode layer so as to control the light emission; and the substrate, the electrode layer and the insulating layer are made of translucent material, so that light emitted by the semiconductor layer can be taken out from a side of the substrate.

As a result, an organic light-emitting transistor having another new configuration by which transistor operation and light-emitting operation can be carried out in a single device can be proposed.

A fifth organic transistor is configured such that: an electrode layer, an insulating layer and an organic semiconductor layer are produced on a substrate in the stated order; and a pair of electrodes are produced to be electrically conductive to the organic semiconductor layer, wherein a configuration is further made such that: the organic semiconductor layer is sealed by a translucent member; a voltage is applied between the pair of electrodes in such a range that the organic semiconductor layer emits light; a voltage is further applied to the electrode layer so as to control the light emission; and light emitted by the semiconductor layer can be taken out through the translucent member.

As a result, an organic light-emitting transistor having another new configuration by which transistor operation and light-emitting operation can be carried out in a single device can be proposed.

A first organic transistor unit includes an organic transistor substrate, in which a plurality of organic transistors each of which is the same as any one of the above-mentioned first through fifth organic transistors, are arranged, disposed in a vacuum airtight state.

As a result, in addition to the above-mentioned advantage, a device function can be stably provided.

A second organic transistor unit includes an organic transistor substrate, in which a plurality of the organic transistors each of which is the same as any one of the above-mentioned first through fifth organic transistors, are arranged, disposed in an inert-gas atmosphere.

As a result, in addition to the above-mentioned advantage, a device function can be stably provided.

A display device includes the above-mentioned first or second organic transistor unit, wherein: light emission of the organic transistors of the organic transistor unit is turned on/off.

As a result, a self light emitting type display device having a new configuration by which transistor operation and light-emitting operation can be carried out in a single device can be proposed.

A first object of a second aspect of the present invention is to propose an organic transistor having new configuration and function.

A second object of the second aspect of the present invention is to propose a configuration by which the organic transistor can be operated more effectively.

A third object of the second aspect of the present invention is to provide a new configuration when a plurality of the organic transistors are arranged.

A fourth object of the second aspect of the present invention is to provide a new configuration by which the organic transistor can be stably operated.

A fifth object of the second aspect of the present invention is to provide a display device employing the organic light-emitting transistors.

In order to achieve these objects of the second aspect of the present invention, a first organic transistor includes a substrate; a pair of electrodes; and an organic semiconductor layer on the substrate between the pair of electrodes, wherein: the substrate is made of an electrically conductive material or a semiconductor material, and has an insulating layer thereon; the organic semiconductor layer and the pair of electrodes are produced on the insulating layer; a part of (a top surface of) the organic semiconductor layer is sealed by a translucent member (sealing structure); a voltage is applied between the pair of electrodes in such a range that the organic semiconductor layer emits light; and further a voltage is applied to the substrate so as to control the light emission of the organic semiconductor layer.

As a result, transistor operation and light-emitting operation can be carried out in a single device.

A first organic transistor unit includes a plurality of organic transistors each of which is the same as the above-mentioned first organic transistor disposed on the substrate.

As a result, in addition to the above-mentioned advantage, application in a self light emitting type display device can be made possible.

In a second organic transistor unit, in the sealing structure, the translucent member is provided separately for each organic transistor in the first organic transistor unit.

As a result, in addition to the above-mentioned advantage, each device can be positively sealed, and thus, performance of each particular device can be stabilized.

In a third organic transistor unit, in the sealing structure, the plurality of organic transistors are sealed by the translucent member in such a manner as to seal the plurality of organic transistors by the single translucent member in the first organic transistor unit.

As a result, in addition to the above-mentioned advantage, manufacturing costs can be reduced.

In the first organic transistor or in any one of the first through third organic transistor units, a vacuum layer may be inserted between the organic semiconductor layer and the translucent member.

As a result, in addition to the above-mentioned advantage, the device performance can be stably provided.

In the first organic transistor or in any one of the first through third organic transistor units, the organic semiconductor layer may be disposed in an inert-gas atmosphere.

As a result, in addition to the above-mentioned advantage, the device performance can be stably provided with age.

In the first organic transistor or in any one of the first through third organic transistor units, the organic semiconductor layer and the translucent member may be made in contact with one another.

As a result, in addition to the above-mentioned advantage, the device performance can be stably provided.

A display device includes organic transistors each of which is the same as the first organic transistor or includes an organic transistor unit the same as any one of the first through third organic transistor units, wherein: light emission amounts of the organic transistors are changed gradually/stepwise.

As a result, a self light emitting type display device having a new configuration such that transistor operation and light-emitting operation can be carried out in a single device, and also, tone expression can be carried out can be proposed.

A first object of a third aspect of the present invention is to propose an organic light-emitting transistor having new configuration and function.

A second object of the third aspect of the present invention is to propose a specific configuration of the organic light-emitting transistor.

A third object of the third aspect of the present invention is to propose a new configuration by which the organic light-emitting transistor can be made to stably function.

A fourth object of the third aspect of the present invention is to provide a display device employing the organic light-emitting transistors.

A fifth object of the third aspect of the present invention is to provide a color display device employing the organic light-emitting transistors.

In order to achieve these objects of the third aspect of the present invention, a first organic transistor includes: a pair of electrodes comprising a first electrode and a second electrode; an organic semiconductor material provided between the pair of electrodes; and a third electrode through an insulating layer in an area in which the organic semiconductor material is provided, wherein: a voltage is applied between the pair of electrodes in such a range that the organic semiconductor material emits light; and a voltage is further applied to the third electrode so as to control the light emission, wherein: a length of the pair of electrodes in an area in which the pair of electrodes face one another is longer than a distance between the pair of electrodes.

As a result, an organic light-emitting transistor having a new configuration by which transistor operation and light-emitting operation can be carried out in a single device can be proposed. Further, in this organic light-emitting transistor, the electrode length in the area in which the pair of electrodes face one another is made longer than the inter-electrode distance between the pair of electrodes. As a result, very high light-emitting efficiency can be achieved.

A second organic transistor is configured such that, in the first organic transistor, the pair of electrodes have comb tooth like shapes on sides facing one another; and the comb tooth shapes are such that they pass each other.

As a result, the electrode length in the area in which the pair of electrodes face one another can be made efficiently longer. As a result, the organic light-emitting transistor having a very high light-emitting efficiency can be achieved.

A third organic transistor is configured such that, in any of the first and second organic transistors, the pair of electrodes are configured so that: the organic semiconductor material is made to emit light in an area in which the pair of electrodes face one another; and an area of the light emission has an elongate shape.

As a result, an organic light-emitting transistor having another new configuration by which transistor operation and light-emitting operation can be carried out in a single device can be proposed.

A fourth organic transistor is configured such that, in any of the first through third organic transistors, a plurality of light emission areas in which the pair of electrodes face one another are produced in a matrix-like arrangement; and each light emission area has an elongate shape such that adjacent three light emission areas produce an approximately square shape.

As a result, an organic light-emitting transistor having another new configuration by which transistor operation and light-emitting operation can be carried out in a single device can be proposed.

A first organic transistor unit includes an organic transistor substrate in which a plurality of the organic transistors, each of which is the same as any of the first through fourth organic transistors, are arranged is disposed in a vacuum airtight state.

As a result, in addition to the above-mentioned advantage, the device performance can be stably provided.

A second organic transistor unit includes an organic transistor substrate in which a plurality of the organic transistors, each of which is the same as any of the first through fourth organic transistors, are arranged is disposed in an inert-gas atmosphere.

As a result, in addition to the above-mentioned advantage, the device performance can be stably provided.

A display device includes the first or second organic transistor unit, wherein: light emission of the organic transistors of the organic transistor unit is turned on/off.

As a result, a self light-emitting display device having a new configuration by which transistor operation and light-emitting operation can be carried out in a single device can be proposed.

A color display device is configured such that in the first display device, a filter is disposed at a position to face a light emission surface of the organic transistors.

As a result, a self light-emitting color display device having a new configuration by which transistor operation and light-emitting operation can be carried out in a single device can be proposed.

A first object of a fourth aspect of the present invention is to propose an organic light-emitting transistor having new configuration and function.

A second object of the fourth aspect of the present invention is to propose a specific configuration of the organic light-emitting transistor.

A third object of the fourth aspect of the present invention is to propose a new configuration by which the organic light-emitting transistor can be made to stably function.

A fourth object of the fourth aspect of the present invention is to provide a display device employing the organic light-emitting transistors.

In order to achieve these objects of the fourth aspect of the present invention, a first organic transistor includes: a pair of electrodes including a first electrode and a second electrode; an organic semiconductor layer provided between the pair of electrodes; and a third electrode provided on the organic semiconductor layer via an insulating layer, wherein: a voltage is applied between the pair of electrodes in such a range that the organic semiconductor layer emits light; and a voltage is further applied to the third electrode so as to control the light emission, wherein: the third electrode includes a patterned electrode made of a translucent member; and the patterned electrode covers an area wider than an area in which the organic semiconductor layer emits light.

As a result, an organic light-emitting transistor having a new configuration by which transistor operation and light-emitting operation can be carried out in a single device can be proposed. Further, since no edge of the electrode pattern is provided in the light-emitting area, a better light emitting part, without being obstructed by the electrode pattern edge, can be achieved.

A second organic transistor is configured such that, in the first organic transistor, the organic semiconductor layer and the pair of electrodes are produced on a substrate; and the third electrode is produced on the organic semiconductor layer via the insulating layer made of a translucent member.

As a result, an organic light-emitting transistor having a more specific new configuration by which transistor operation and light-emitting operation can be carried out in a single device can be proposed.

A third organic transistor is configured such that, in the first organic transistor, on a substrate made of a translucent member, the third electrode, the insulating layer made of a translucent member and the organic semiconductor layer are produced in the stated order; and the pair of electrodes made electrically conductive to the organic semiconductor layer are produced.

As a result, an organic light-emitting transistor having another specific new configuration by which transistor operation and light-emitting operation can be carried out in a single device can be proposed.

A first organic transistor unit includes an organic transistor substrate in which a plurality of the organic transistors, each of which is the same as any of the first through third organic transistors, are arranged is disposed in a vacuum airtight state.

As a result, in addition to the above-mentioned advantage, the device performance can be stably provided.

A second organic transistor unit includes an organic transistor substrate in which a plurality of the organic transistors, each of which is the same as any of the first through third organic transistors, are arranged is disposed in an inert-gas atmosphere.

As a result, in addition to the above-mentioned advantage, the device performance can be stably provided.

A display device includes the first or second organic transistor unit, wherein: light emission of the organic transistors of the organic transistor unit is turned on/off.

As a result, a self light-emitting display device having a new configuration by which transistor operation and light-emitting operation can be carried out in a single device can be proposed.

A first object of a fifth aspect of the present invention is to propose a specific configuration of a display device employing an organic light-emitting transistor having new configuration and function.

A second object of the fifth aspect of the present invention is to propose a new configuration by which the display device can be stably operated.

In order to achieve the objects of the fifth aspect of the present invention, a first display device includes a light emitting substrate in which a plurality of organic transistors are arranged, each of the plurality of organic transistors includes: a pair of electrodes, i.e., a first electrode and a second electrode; an organic semiconductor material provided between the pair of electrodes; and a third electrode provided on the organic semiconductor layer via an insulating layer, wherein: a voltage is applied between the pair of electrodes in such a range that the organic semiconductor layer emits light; and a voltage is further applied to the third electrode so as to control the light emission; and an optical filter at a position such as to face a light emitting surface of the light-emitting substrate, wherein: the pair of electrodes is configured such that an area from which the organic semiconductor layer emits light has an elongate shape; and the optical filter is produced to have a corresponding elongate shape.

As a result, a display device having a new configuration by which transistor operation and light-emitting operation can be carried out in a single device, and also, having a high light-emitting efficiency, can be proposed.

A second display device is configured such that, in the first display device, three of the elongate light emitting areas are arranged side by side so that an approximately squire light emitting area is obtained; correspondingly, three of the optical filters are arranged side by side so that an approximately squire shape is obtained; the optical filters include those for three colors, and also, a filter area for the three colors forms an approximately square area.

As a result, in addition to the above-mentioned advantage, a color display device providing a high grade display function can be achieved.

A third display device is configured such that, in the first or second display device, the light-emitting substrate and the filter are laminated; and the laminated device thus obtained is disposed in a vacuum airtight state.

As a result, in addition to the above-mentioned advantage, the device performance can be stably provided.

A fourth display device is configured such that, in the first or second display device, the light-emitting substrate and the filter are laminated; and the laminated device thus obtained is disposed in an inert-gas atmosphere.

As a result, in addition to the above-mentioned advantage, the device performance can be stably provided.

A fifth display device is configured such that, in the first or second display device, the light-emitting substrate and the filter are laminated; and an area from which the organic semiconductor layer emits light is made in a vacuum airtight state.

As a result, in addition to the above-mentioned advantage, the device performance can be stably provided, and also, the configuration can be simplified.

A sixth display device is configured such that, in the first or second display device, the light-emitting substrate and the filter are laminated; and an area from which the organic semiconductor layer emits light is disposed in an inert-gas atmosphere.

As a result, in addition to the above-mentioned advantage, the device performance can be stably provided, and also, the configuration can be simplified.

BRIEF DESCRIPTION OF THE DRAWINGS

Other objects and further features of the present invention will become more apparent from the following detailed description when read in conjunction with the accompanying drawings.

DETAILED DESCRIPTION OF THE PREFERRED EMBODIMENTS

Embodiments of the present invention will now be described with reference to figures.

Figure 2:
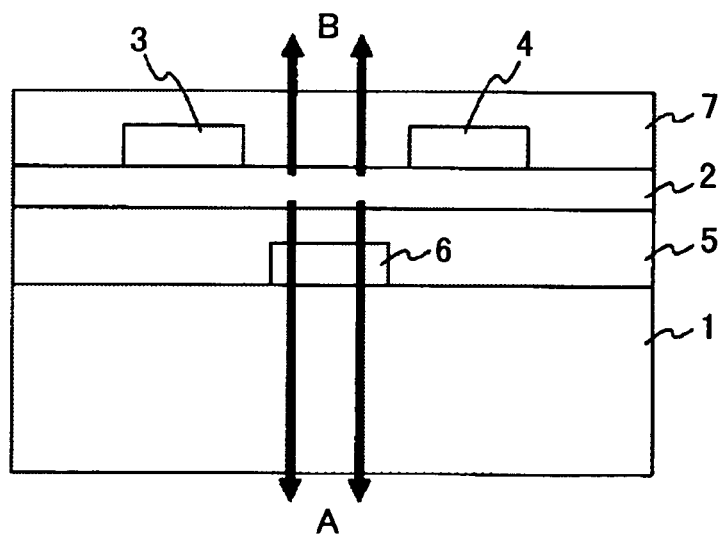
FIG. 2 shows an example of a configuration (a bottom gate type) of an organic transistor device according to the present invention.
Figure 3:
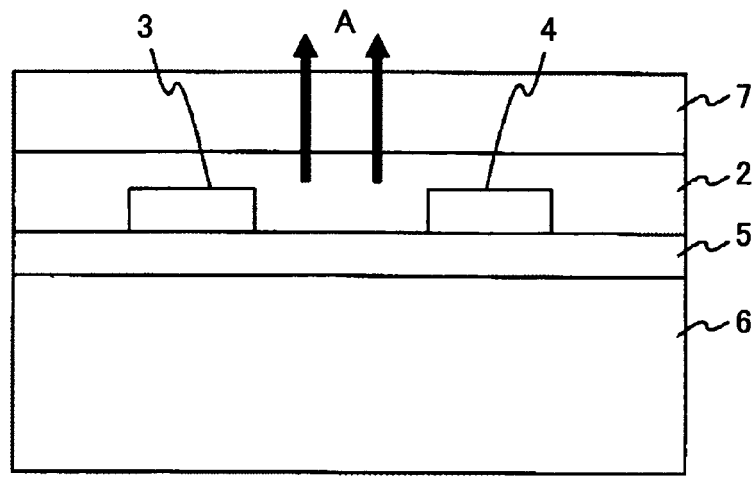
FIG. 3 shows an example of a configuration of a variant example of an organic transistor device according to the present invention.

The light emitting type organic thin-film transistor device according to the present invention is generally classified into a top gate type and a bottom gate type. A light emitting type organic thin-film transistor device according to the present invention in the top gate type has a source electrode and a drain electrode, in contact with an organic semiconductor layer, on a supporting body, and further thereon, has a gate electrode through a gate insulating layer. In the bottom gate type, a gate electrode is provided on a supporting body first, and a source electrode and a drain electrode are provided which are joined by means an organic semiconductor layer, through a gate insulating layer. Specific layer structure examples of the devices (sectional views of single devices) are shown in FIGS. 1 through 3.

Figure 1:
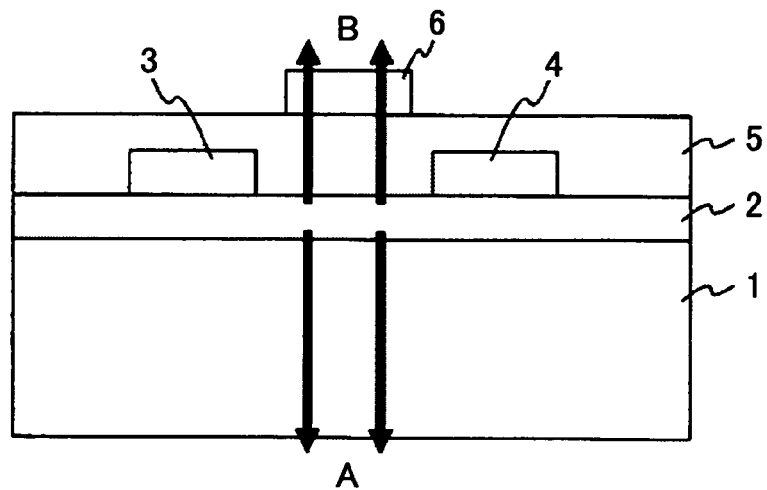
FIG. 1 shows an example of a configuration (a top gate type) of an organic transistor device according to the present invention.

FIG. 1 shows one example of a layer configuration of a top gate type of a light emitting type organic thin-film transistor device. As shown, laminated layers are produced with a substrate or a sheet as a supporting body 1, and thereon, an organic semiconductor layer 2 is produced. Further, a source electrode 3 as a first electrode and a drain electrode 4 as a second electrode, electrically connected to the organic semiconductor layer 2, are arranged in a predetermined position with a predetermined distance. In an area between the pair of these electrodes, a gate electrode 6 as a third electrode is disposed through a gate insulating layer 5. In other words, the gate insulating layer 5 is disposed to cover a top surface of the organic semiconductor layer 2 and the source electrode 3 and the drain electrode 4, and further, the gate electrode 6 is disposed at an appropriate position on the gate insulating layer 5 (position between the source electrode 3 and the drain electrode 4). Then, a voltage is applied between the source electrode 3 and the drain electrode 4 in such a range that the organic semiconductor layer 2 emits light. Further, a voltage is applied to the gate electrode so as to control the light emission.

As will be described later, as a material of the substrate of the supporting body 1, a translucent material may be used, so that light can be taken out from the side of the supporting body 1 (in a direction of an arrow A of FIG. 1).

Alternatively, also description will be made later for a material and so forth, and the gate insulating layer 5 and the gate electrode 6 may be made of translucent material, so that light can be taken out from the side of the gate electrode 6 (in a direction of an arrow B of FIG. 1).

FIG. 2 shows a layer configuration example of a bottom gate type light emitting type organic thin-film transistor device. A gate electrode 6 is disposed on a substrate or a sheet as a supporting body 1, and also, a gate insulating layer 5 is disposed to cover the top surface of the substrate and the gate electrode 6. Then, on the gate insulating layer 5, the organic semiconductor layer 2 is produced in a form of a film. Further, on the top surface of the organic semiconductor layer 2, a source electrode 3 and a drain electrode 4 are disposed in a jointing manner thereto with a predetermined distance. The gate electrode 6 is disposed to be located at the center between the source electrode 3 and the drain electrode 4. In other words, on the supporting body 1, an electrode layer of the gate electrode (third electrode) 6, the gate insulating layer 5 and the organic semiconductor layer 2 are produced in the stated order. Further the organic semiconductor layer 2, and a pair of electrode layers of the source electrode (first electrode) 3 and the drain electrode (second electrode) 4 being electrically connected thereto, are produced. Further, a device protection layer 7 covers the area of the organic semiconductor layer 2. Further, between the source electrode 3 and the drain electrode 4, a voltage is applied in such a range that the organic semiconductor layer 2 emits light. Further, a voltage is applied to the gate electrode 6. Thus, on the substrate or sheet of the supporting body 1, the electrode layer of the gate electrode 6, the gate insulating layer 5, and the organic semiconductor layer 2 are produced in the stated order. Further, the pair of electrode layers of the source electrode 3 and the drain electrode 4 electrically connected to the organic semiconductor layer 2 are produced. Further, the device protection layer 4 is provided to seal the area of the organic semiconductor layer 2. A voltage is applied between the source electrode 3 and the drain electrode 4 in such a range than the organic semiconductor layer 2 emits light. Further, a voltage is applied to the gate electrode 5 to control the light emission.

As the substrate material of the supporting body 1, as will be described later, translucent material may be used. Further, also the gate electrode 6 and the gate insulating layer 5 may be made of translucent material as will be described later. Thereby, light can be taken out from the side of the supporting body 1 (in a direction of an arrow A of FIG. 2).

Attentively, the device protection layer 7 may be made of translucent material such as silicon oxide, and a sealing structure may be provided. As a result, light can be taken out in a direction of an arrow B of FIG. 2. As will be described later, when sealing is carried out in such a form that the entirety of the organic transistor is made in a vacuum airtight condition or disposed in an inert-gas atmosphere, the device protection layer 7 is not required.

FIG. 3 shows a variant example of the bottom gate type of light emitting type organic thin-film transistor device. A substrate made of electrically conductive material or a semiconductor material is used as a supporting body 1, and also, is used as a gate electrode 6. A gate insulating layer 5 is produced to cover the substrate A (gate electrode 6) made of the electrically conductive material or semiconductor material, and further, on the gate insulating layer 5, an organic semiconductor layer 2 and a pair of electrode layers of a source electrode 3 and a drain electrode 4 electrically connected thereto are produced. Finally, a device protection layer 7 is produced and thus, a sealing structure is provided. The organic semiconductor layer 2 is produced to cover the gate insulating layer 5 and both electrodes 3 and 4.

Then, a voltage is applied between the source and drain electrodes 3 and 4 in such a range that the organic semiconductor layer 2 emits light. Further, a voltage is applied to the gate electrode 6 to control the light emission.

By configuring the device protection layer 7 of translucent material such as silicon oxide, light can be taken out in a direction of an arrow A of FIG. 3.

As will be described later, when sealing is carried out in such a form that the entirety of the organic transistor is made in a vacuum airtight condition or disposed in an inert-gas atmosphere, the device protection layer 7 is not required.

As material of the organic semiconductor layer employed in the light emitting type organic thin-film transistor device, pi-conjugated material is used. For example, polypyrrole, a polypyrrole family such as poly(N-substituted pyrrole), poly (3-substituted pyrrole), poly(3,4-disubstituted pyrrole), a polythiophene family such as poly(3-substituted thiophene), poly(3,4-disubstituted thiophene), polybenzothiophene, a polyisobenzothiofuran family such as polyisobenzothiofuran, polythienylenevinylene family such as polythienylenevinylene, a poly(p-phenylenevinylene) family such as poly(p-phenylenevinylene), a polyaniline family such as polyaniline, poly(N-substituted aniline), poly(3-substituted aniline), poly (2,3-substituted aniline), a polyacetylene family such as polyacetylene, a polydiacetylene family such as polydiacetylene, a polyazulene family such as polyazulene, a polypyrene family such as polypyrene, a polycarbazole family such as polycarbazole, poly(N-substituted carbazole), a polyselenophene family such as polyselenophene, a polyfuran family such as polyfuran, polybenzofuran, a poly(p-phenylene) family such as poly(p-phenylene), a polyindole family such as polyindole, pyridazine family such as pyridazine, a polyacene family such as naphthacene, pantacene, hexacene, heptacene, dibenzopentacene, tetrabenzopantacene, pyrene, dibenzopyrene, chrysene, perylene, coronene, terylene, ovalene, quoterylene, circumanthracene, derivative obtained from substitution of part of carbon of the polyacene family (triphenodioxazine, triphenodithiazine, hexacene-6,15-quinone or such), polymer such as polyvinylcarbazole, polyphenylenesulfide, polyvinylenesulfide, may be used.

Further, thiophene hexamer, for example, having same repeating units as those of these polymers, i.e., α-sexithiophene, α,ω-dihexyl-α-sexiothiophene, α,ω-dihexyl-α-quinquethiophene, α,ω-bis(3-butoxypropyl)-α-sexithiophene, or oligomer such as styrylbenzene derivative may be preferably used.

Further, metal phtharosyanene family such as copper phthalocyanine, fluorine-substituted copper phtharosyanene, condensed ring tetracarboxilic acid diimide family such as naphthalene 1,4,5,8-tetracarboxilic acid diimide, N,N'-bis(4-trifluoromethylbenzil)naphthalene 1,4,5,8-tetracarboxilic acid diimide, also, N,N'-bis(1H, 1H-perfluorobutyl), and a naphthalene tetracarboxilic acid diimide family such as N,N'-dioctylnaphthalene 1,4,5,8-tetracarboxilic acid diimide derivative, naphthalene 2,3,6,7 tetracarboxilic acid diimide, and an anthracenetetracarboxilic acid diimide family such as anthracene 2,3,6,7 tetracarboxilic acid diimide, a fullerene family such as C60, C70, C76, C78, C84, carbon nanotube such as SWNT, a dye family such as a merocyanine dye family, hemicyanine dye family, may be used.

Among these pi-conjugate materials, one of a group of oligomer having the number of repeating units n in a range between 4 and 10, or polymer having the number of repeating units n more than 20, in which thiophene, vinylene, thienyrelenvinylene, phenylenevinylene, p-phenylene, substation thereof, or a plurality thereof is used as a repeating unit, polycyclic aromatic compound such as pentacene, a fullerene family, a condensed ring tetracarboxilic acid diimide family and metal phthalocyanine, may be preferable.

As another organic semiconductor material, organic molecular complex such as tetrathiafulvalene (TTF)-tetracyanoquinodimetane (TCNQ) complex, bisethylenetetrathiafulvalene (BEDTTTF)-perchloric acid complex, BEDTTTF-iodine complex or TCNQ-iodine complex may be used. Further, σ conjugate polymer such as polysilane or polygermane may be used.

The light emitting type organic semiconductor material according to the present invention has, for example, as a main ingredient, copolymer having a repeating unit expressed by the following general formula. The material will be described in detail including a method of producing the same.

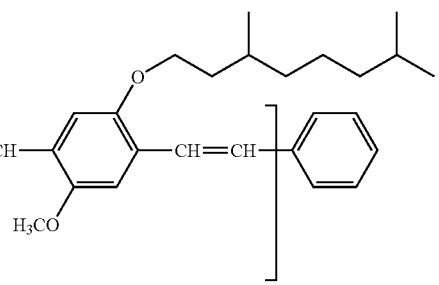

For example, in a carboxyl group expressed by the flowing general formula (I), and a phosphate compound expressed by the following general formula (II) are reacted, and a copolymer having a repeating unit of the following general formula (III) is produced.

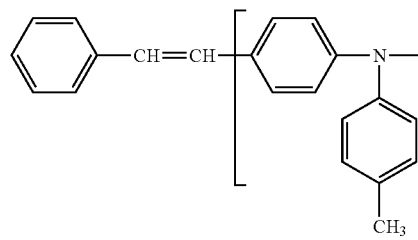

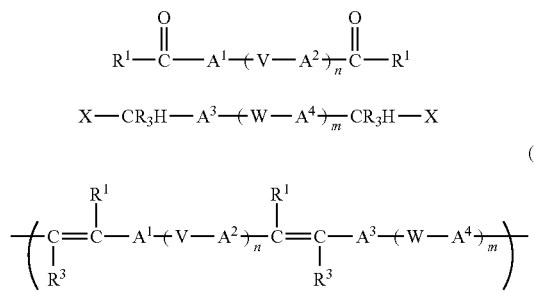

In the general formula (I), A1, A2 denote substituted or non-substituted monocyclic or polycyclic arylene group or heteroarylene group. R1 denotes hydrogen, substituted or non-substituted alkyl group, or substituted or non-substituted aryl group. V denotes O—, —S— or —NR2-. R2 denotes substituted or non-substituted monocyclic or polycyclic arylene group, or, substituted or non-substituted monocyclic or polycyclic heteroarylene group. Further, $n \geq 0$.

In the general formula (II), A3, A4 denote substituted or non-substituted monocyclic or polycyclic arylene group or heteroarylene group. R3 denotes hydrogen, substituted or non-substituted alkyl group, aryl group or heteroaryl group. W denotes —O—, —S— or —NR4-. R4 denotes substituted or non-substituted monocyclic or polycyclic arylene group, or, substituted or non-substituted monocyclic or polycyclic heteroarylene group. Further, $m \geq 0$. X denotes PO(OR5) or P(R6)3+Y—. R5 denotes lower alkyl group. R6 denotes substituted or non-substituted aryl group, or, substituted or non-substituted alkyl group. Y denotes halogen atom.

Below further details are described.

Preferably usable base compound preferably used includes all of generally known base compounds as long as they are dissolved uniformly in nonaqueous solvent. However, in consideration of organization potency of phosphonate carbanion, in a basicity viewpoint, metal alcoxide, metal hydride, organic lithium compound or such is preferable. For example, potassium t-butoxide, sodium t-butoxide, lithium t-butoxide, potassium 2-methyl-2-butoxide, sodium 2-methyl-2-butoxide, sodium-methoxide, sodium-ethoxide, potassium-ethoxide, potassium-methoxide, sodium hydride, potassium hydride, methyl lithium, ethyl lithium, propyl lithium, n-butyl lithium, s-butyl lithium, t-butyl lithium, phenyl lithium, lithium naphtylide, lithium amide, lithium diisopropyl amide, or such may be used.

As the solvent dissolving base, solvent which can provide stable solution with base should be selected. Another factor is that one having high solubility of base is preferable. Further, one which does not degrade solubility with respect to high molecular weight reaction solvent which is produced in a reaction system is preferable. Depending on base to use and property of high molecular weight substance to produce, any one may be selected from generally known alcoholic solvent, ether solvent, amin solvent, hydrocarbon solvent and so forth.

As a combination of base and solvent to which the base is uniformly dissolved, solutions of various combinations may be used, such as methanol solution of sodium methoxide, ethanol solution of sodium ethoxide, 2-propanole solution of potassium t-butoxide, 2-methyl-2-propanonle solution of potassium t-butoxide, tetrahydrofuran solution of potassium t-butoxide, dioxane solution of potassium t-butoxide, hexane solution of n-butyl lithium, ether soliution of methyl lithium, tetrahydrofuran solution of lithium t-butoxide, cyclohexane solution of lithium diisopropyl amide, toluene solution of potassium bistrimethyl silyl amide or such. Some of them may be easily obtained as commercial items. In viewpoints of mild reaction condition, easiness in handling, solution of metal alcoxide may be preferably used. In viewpoints of solubility of polymer to produce, easiness in handling of the same, efficiency of reaction, ether solution of metal t-butoxide may be used more preferably. Further preferably, tetrahydrofuran solution of potassium t-butoxide may be used.

Solution stoichimetrically equally including phosphorous compound and aldehyde compound, and the above-described base solution including base in the double molar amount may be mixed, and thus, polymerization reaction will easily progress. Thus, polymer of a high molecular weight, preferably controlled in a narrow molecular weight distribution can be easily obtained. Ordinarily, an amount of base which should be used is an equal amount with respect to a polymerization active spot of phosphorus compound. However, no problem occurs when an excessive amount is used.

The above-mentioned polymerization reaction may also be made as a result of base solution being added to solution of phosphorus compound and aldehyde compound, as a result of solution of phosphorous compound and aldehyde compound being added to base solution, or, as a result of they being added at the same time to a reaction system. No limitation exists for an order of the addition.

Polymerization time required for the above-mentioned polymerization should be set appropriately depending on reactivity of monomer to use, a molecular weight of polymer to obtain, or such. 0.2 through 30 hours is preferable. Further, sealant for sealing an end of polymer may be added during the reaction or after the reaction. The same may be added at the time of beginning of the reaction.

Control of reaction temperature in the above-mentioned polymerization is not required. The reaction sufficiently will progress even at a room temperature. Heating may be made for the purpose of increasing reaction efficiency, or, cooling may be made for the purpose of obtaining mild condition.

Embodiments will now be described for further specific examples. However, embodiments of light emitting type organic semiconductor material are not limited thereto as long as its basic concept is not deviated from.

Various sorts of measurements were carried out as follows: Measurements of polymer's number average molecular weight (Mn), weight average molecular weight (Mw) and molecular weigh distribution (Mw/Mn) were carried out with the use of a gel permeation chromatography (GPC). By using UV absorption and differential refractive index, the measurements were carried out on a polystyrene equivalent basis with monodisperse polystyrene as a standard.

<Material Producing Embodiment>

In a 100 ml four-neck flask, 0.852 g (2.70 mmol) of dialdehyde expressed by the following formula:

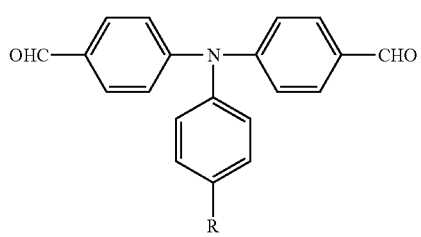

and 1.525 g (2.70 mmol) of diphosphonate expressed by the following formula:

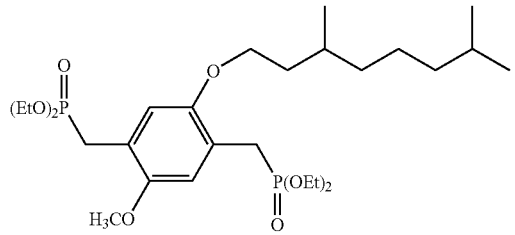

were put. Nitride substitution was carried out, and then, 75 ml of tetrahydrofuran was added. In this solution, 6.75 ml (6.75 mmol) of potassium-butoxide's 1.0 mol dm-3 tetrahydrofuran solution was dropped. Then, stirring was carried out for 20 hours at a room temperature. After that, benzylphosphonate and benzaldehyde were added in sequence. Then, stirring was carried out for 2 hours 30 minutes. Finally, approximately 1 ml of acetic acid was added. Thus, reaction was finished. Then the solution was washed. Therefrom, solvent was extracted under reduced pressure. Purification was carried out from the residual with the use of 15 ml of tetrahydrofuran and 80 ml of methanol. Thus, 1.07 g of polymer expressed by the following chemical formula was obtained:

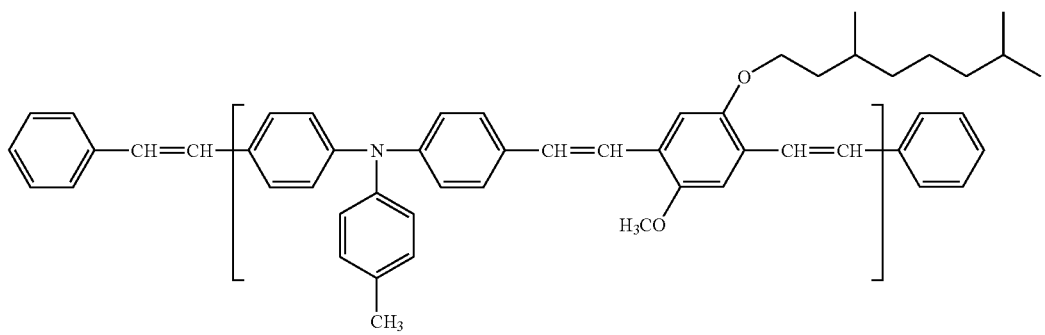

A molecular weight and molecular weight distribution of the thus-obtained were measured. As a result, data of the polymer was as follows: yield: 73%, weight average molecular weight (Mw): 104000; numeral average macular weight (Mn): 36000; molecular weight distribution (Mw/Mn): 2.89; and polymer: 63.

The above-mentioned embodiment is one example, and, other material may be used. For example, from substance, such as pantacene, having precursor soluble in solvent, a film of the precursor, produced by means of a liquid spraying principle or such described later, may be processed thermally, and may be used for producing a thin film of organic material as the object material.

From the light emitting type organic semiconductor material according to the present invention thus obtained, which is high-molecular weight polymer, a satisfactory thin film having superior strength, ductility and durability and so forth, without cracks, can be produced by means of a well-known film forming method such as a spin coat method, a cast method, a dip method, a liquid spray method, a doctor blade method, a screen printing method, or such.

Especially, a method of liquid spraying principle (which may be called 'ink jet method') is an art having high general purpose properties and thus may be applied for an electrode pattern production described later. Thus, this method may be effectively used for producing a light emitting type organic thin-film transistor device according to the present invention. A result of study for a manufacturing apparatus for carrying out this method will now be described.

Figure 4:
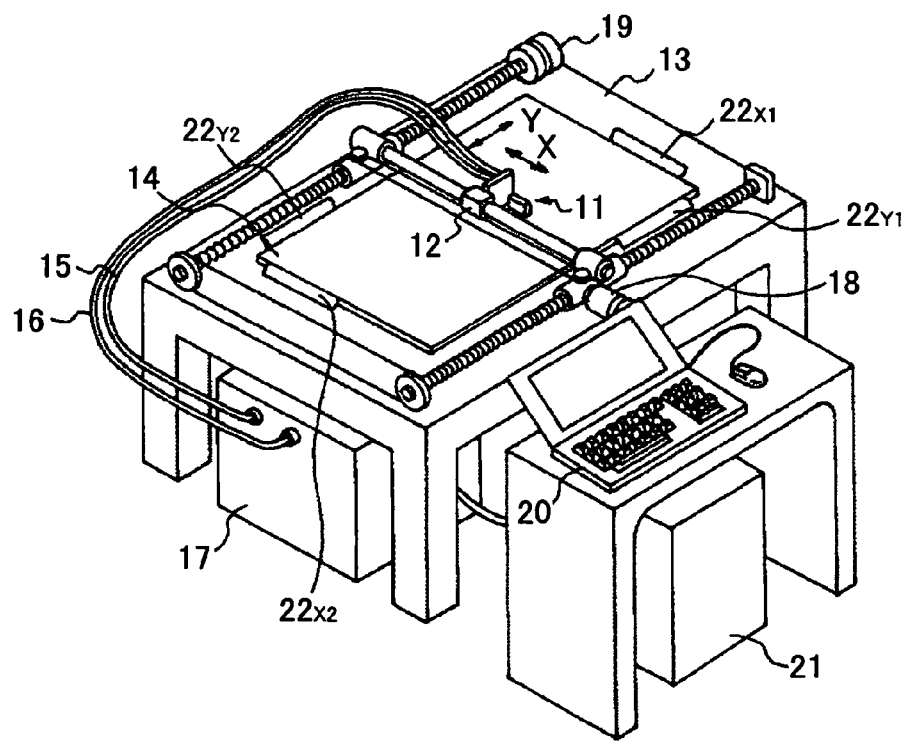
FIG. 4 illustrates one embodiment of a liquid drop jetting manufacturing apparatus for manufacturing a light emitting type organic thin-film transistor device according to the present invention.

FIG. 4 illustrates one embodiment of a manufacturing apparatus usable for manufacturing a light emitting type organic thin-film transistor device according to the present invention. In FIG. 4, 11 denotes a jetting head unit (jetting head), 12 denotes a carriage, 13 denotes a substrate supporting table, 14 denotes a light emitting type organic thin-film transistor device substrate or sheet, 15 denotes solution supplying tube, 16 denotes a signal supplying cable, 17 denotes a jetting head control box (including a solution tank), 18 denotes a X-direction scan motor for the carriage 12, 19 denotes a Y-direction scan motor for the carriage 12, 20 denotes a computer, 21 denotes a control box and 22 (22X1, 22Y1, 22X2, 22Y2) denotes substrate positioning/holding devices. In this case, the jetting head moves in front of the substrate or sheet 14 placed on the substrate holding table 13 by means of carriage scanning, and solution is jetted therefrom. Although this example is an example in which the jetting head 11 moves by means of carriage scanning, the jetting head 11 may be fixed, while the substrate or sheet 11 may be moved instead, as in another configuration of the manufacturing apparatus (not shown) That is, the apparatus in which the jetting head 11 and the substrate or sheet 11 mutually move with respect to each other may be used for producing a light emitting type organic thin-film transistor device according to the present invention.

As liquid drop providing devices (jetting head 33) of the jetting head 11, any mechanism may be used as long as it can jet a predetermined amount of liquid drop. Especially, a mechanism according to an ink jet principle which can produce a liquid drop on the order of 0.05 pl through several hundreds of pl is preferable.

As the ink jet method, one which is generally called a drop on demand method may be used in which, as disclosed by U.S. Pat. No. 3,683,212 (Zoltan method), U.S. Pat. No. 3,747, 120 (Stemme method) or U.S. Pat. No. 3,946,398 (Kyser method), an electrical signal is applied to a piezo vibration device, the electrical signal is transformed into a mechanical vibration, and liquid drops are jetted so as to fly from fine nozzles according to the mechanical vibration.

Alternatively, a method (Sweet method) disclosed by U.S. Pat. No. 3,596,275 or U.S. Pat. No. 3,298,030 may be used. In this method, according to a continuous vibration generating method, small drops of recording liquid having electrically charge amounts controlled are generated, the generated small drops having the electrically charge amounts controlled are made to fly between deflection electrodes to which a uniform electric field is applied, and thus, recording is made on a recording member. Normally, this method is called a continuous flow method, or an electrical charge control method.

Further alternatively, a method disclosed by Japanese Patent Publication No. 56-9429 may be used. In this method, air bubbles are generated in liquid, and liquid drops are jetted from fine nozzles thanks to functional force of the air bubbles. This method is called a thermal ink jet method or bubble jet method (registered trademark).

Any liquid jetting method may be selected from the drop on demand method, the continuous flow method, the thermal ink jet method and so forth appropriately according to particular requirements.

According to the present invention, in the light emitting type organic thin-film transistor device manufacturing apparatus (FIG. 4), a position of holding the substrate 14 is adjusted and determined by the substrate positioning/holding device 22. Although not shown in detail, the substrate positioning/holding device 22 is configured such that the substrate 14 is contacted therewith, and the position of the substrate 14 can be adjusted on the order of submicron in an X direction and a Y direction perpendicular thereto. Further, the substrate positioning/holding device 22 is connected to the jetting head control box 17, the computer 20, the control box 21 and so forth. As a result, its position information, fine adjustment position change information, liquid drop position information, timing and so forth can be always fed back.

Further, the manufacturing apparatus usable for manufacturing a light emitting type organic thin-film transistor device according to the present invention has a rotational position adjustment mechanism (not shown since it is located under the substrate 14) in addition to the X-Y direction positional adjustment mechanism.

In this relation, a shape of the light emitting type organic thin-film transistor device substrate according to the present invention, an arrangement of a device group to be produced, and so forth, will now be described first.

As the light emitting type organic thin-film transistor device substrate (organic transistor unit) according to the present invention, as will be described later, depending on a purpose or a use thereof, various sorts of plastic substrate such as a glass substrate, a ceramic substrate, PET, a semiconductor substrate such as Si, a glass epoxy substrate, a flexible substrate made of high molecular weight film such as a polyimide film, a polyamideimide film, a polyamide film, a polyester film and so forth may be preferably used. For example, the various sorts of plastic substrates or high molecular weight films may be advantageously used for a pattern writing substrate for which weight reduction is required, or for manufacturing various sorts of functional devices such as light emitting type organic thin-film transistor devices according to the present invention.

Further, during manufacturing such devices, heat may be applied in a mid process. Upon manufacturing a high-accuracy device, degradation in device accuracy due to thermal expansion should be taken into account. For example, according to the present invention, in order to manufacture a high-accuracy light emitting type organic thin-film transistor device, polymer material may be preferably used, which has such a low linear expansion coefficient $\alpha$ ($=1/l_0 \cdot dl/dt$, where $l_0$ denotes a length at a temperature of $0°$ C.; l denotes a length at a temperature of $t°$ C.) that $\alpha/K^{-1} = 20$ through $50 \times 10^{-6}$ at 295 K ($20°$ C.) or less, which is near linear expansion coefficient of metal.

As a transparent substrate having such low linear expansion coefficient, for example, composite material in which transparent polymer material is reinforced by transparent nanofiber reinforced fiber in biosystem having a diameter on the order of 50 through 100 nm may be used. Therewith, transmittance of 90 through 95% may be obtained for parallel light.

A shape of various sorts of plastic substrate or a high molecular weight film used as a light emitting type organic thin-film transistor device according to the present invention is a rectangle, for the purpose of economically manufacture, a supply of such a substrate, or for a use of the thus-finally-produced light emitting type organic thin-film transistor device substrate. That is, the substrate to use has vertical two sides, parallel to each other, and horizontal two sides, parallel to each other, and vertical and horizontal sides form a right angle.

According to the present invention, on the substrate, a group of light emitting type organic thin-film transistor devices are arranged in a matrix manner, such that two direction perpendicular to one another of sides of the matrix are parallel to a vertical direction side and a horizontal direction side of the substrate, respectively. A reason why the light emitting type organic thin-film transistor device group is arranged in the matrix manner and a reason why the vertical and horizontal sides of the substrate are made parallel to the perpendicular two directions of the matrix, respectively, will now be described.

In the light emitting type organic thin-film transistor device manufacturing apparatus shown in FIG. 4 which can be applied to the present invention, after a relationship between the substrate 14 and solution jetting nozzle surface of the jetting head unit 11 is first determined, position control should not specially be carried out. That is, the jetting head unit 11 moves mutually in parallel in X/Y directions with respect to the surface in which the light emitting type organic thin-film transistor device group are produced, with a fixed distance kept with respect to the substrate 14. In this condition, the above-mentioned solution is jetted. The X/Y directions are mutually perpendicular two directions, and positioning of the substrate 14 is made in such a manner that the vertical or horizontal direction of the substrate is parallel to the Y or X direction. Thereby, the two directions of the matrix-arrangement of the light emitting type organic thin-film transistor device group are parallel thereto, respectively. Accordingly, the light emitting type organic thin-film transistor device group or an electrode pattern can be produced with a high accuracy only with the mechanism which mutually moves and jets the solution. In other words, as a result of the substrate shape, i.e., the light emitting type organic thin-film transistor device group matrix arrangement and the perpendicular X/Y direction mutually moving apparatus being used, the high accuracy light emitting type organic thin-film transistor device group matrix arrangement can be achieved merely as a result of accurately producing the light emitting type organic thin-film transistor devices or positioning the substrate before carrying out the electric pattern production liquid drop jetting.

Returning to the rotational positional adjustment mechanism, description will now be made. As described above, according to the present invention, the high accuracy light emitting type organic thin-film transistor device matrix arrangement is achieved as a result of accurately positioning the substrate being carried out before light emitting type organic thin-film transistor device producing liquid drop jetting operation, and then, merely mutual movement in X/Y directions is carried out without requiring any other control. A matter to take into account is a possible shift occurring in a rotational direction (a rotational direction about an axis perpendicular to the plane defined by the X/Y directions) which may occur when the substrate is first positioned.

In order to correct the shift in rotation direction, according to the present invention, as mentioned above, the rotational position adjustment mechanism is provided. Thereby, the rotational axis shift is corrected. As a result, in the apparatus according to the present invention, only with mutual movement in the X/Y directions, a high accuracy light emitting type organic thin-film transistor device matrix arrangement can be obtained.

In the above, description has been made assuming that the rotational positional adjustment mechanism is separate from the substrate positioning/holding device 22 (22X1, 22Y1, 22X2, 22Y2) shown in FIG. 4. However, the rotational positional adjustment mechanism may be included in the substrate positioning/holding device 22. For example, originally, the substrate positioning/holding device 22 contacts the sides of the substrate 14 and the entirety of the substrate positioning/holding device 22 can adjust X/Y direction positions. However, by configuring such that two screws provided apart can move separately at the positions at which the substrate positioning/holding device 22 contacts the substrate 14, angle adjustment can be achieved. The same as for the above-mentioned X/Y direction position adjustment information and fine adjustment position change information and so forth, the rotational positional adjustment control information is also transmitted to the jetting head control box 17, the computer 20, the control box 21 and so forth. As a result, drop providing position information, timing and so forth can be always fed back.

The above description assumes that the substrate or sheet preferably used in the present invention has basically a rectangular shape. However, as an exception, a semiconductor substrate such as Si is provided in a form of a round wafer, and, in this case, one linear side, called orientation flat, indicating a crystal orientation axis direction, should be made to contact the above-mentioned substrate positioning/holding device 22.

Another configuration for positioning will now be described. In the above description, the substrate positioning/holding device 22 is made to contact the sides of the substrate 14, and the entirety of the substrate positioning/holding device 22 carries out positioning in the X/Y directions. However, in the other configuration described now, different therefrom, other than the sides of the substrate 14, for example, mutually perpendicular belt-like patterns are provided on the substrate. As described above, according to the present invention, on the substrate, a light emitting type organic thin-film transistor device group is arranged in a manner of a matrix. In this example, the above-mentioned mutually perpendicular two-direction band-like patterns are produced in such a manner that the band-like patterns are parallel to the mutually perpendicular two directions of the matrix. These patterns can be easily produced by means of a photo-fabrication technology on the substrate.

Figure 5:
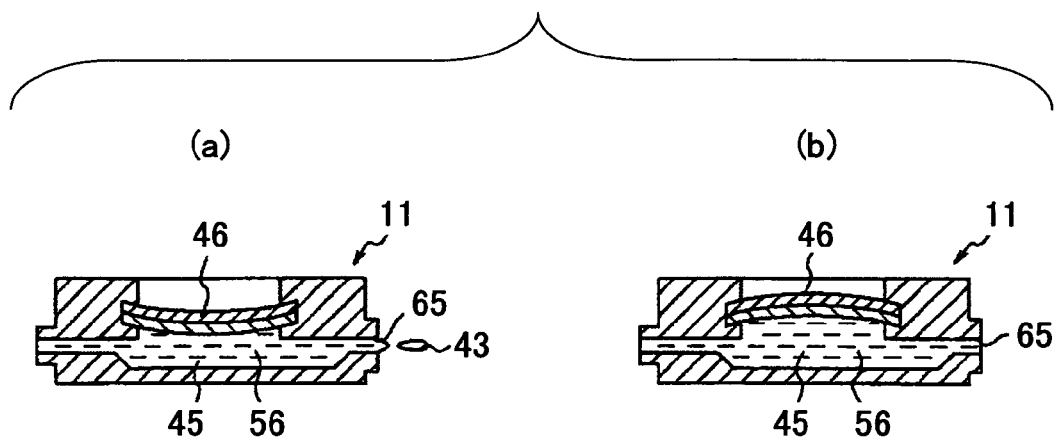
FIG. 5 illustrates a liquid drop jetting principle of a jetting head employing a piezo device preferably employed in the apparatus for manufacturing a light emitting type organic thin-film transistor device according to the present invention.
Figure 6:
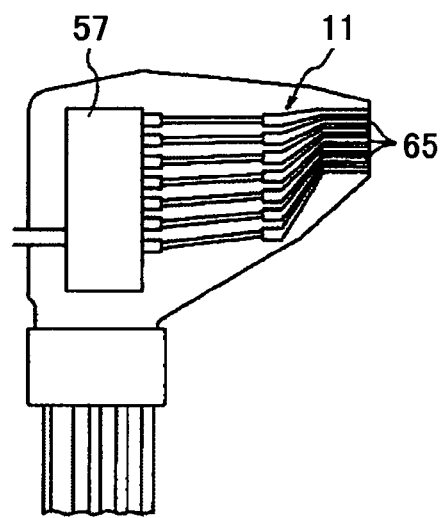
FIG. 6 shows a structure of a jetting head employing a piezo device preferably employed in the apparatus for manufacturing a light emitting type organic thin-film transistor device according to the present invention.

Next, with reference to FIGS. 5 and 6, the liquid jetting head preferably applicable to the production of a light emitting type organic thin-film transistor device according to the present invention will now be described. This example is an example of 7 nozzles.

In this liquid jetting head, a piezo device 46 is provided in a flow path 45 through which solution 56 is introduced, as an energy function part. A pulse-like signal voltage is applied to the piezo device 46, thus the piezo device 46 is deformed as shown in FIG. 5 (a), and thereby, a volume of the flow path 45 is reduced. Also, pressure waves occur, whereby liquid drops are jetted from a nozzle 65. FIG. 5 (b) shows a state in which the volume of the flow path 45 increases when the piezo device 46 returns to an original state since the piezo device 46 restores from the distortion.

The solution 56 introduced into the flow path 45 immediately before the nozzle 65 is one already having passed through a filter 57. According to the present invention, the filter 57 is provided in the jetting head, and thus, filtering function is provided nearest to the nozzle 65. Thereby, foreign particles are trapped from the solution according to the present invention, and thus, degradation in performance of the electrode patterns or organic light emitting material patterns produced on the substrate can be avoided. Such a filter 57 may be one which is small-sized simple filter. Thereby, it can be assembled in the jetting head 11 shown in FIG. 6. As a result, the jetting head 11 can be made compact.

As such a filter 57, a stainless mesh filter may be preferably used for example. A hole diameter (i.e., filtering mesh size: a lower limit of a size of foreign particle which can be removed therewith) thereof is 0.2 μm through 2 μm.

Figure 7:
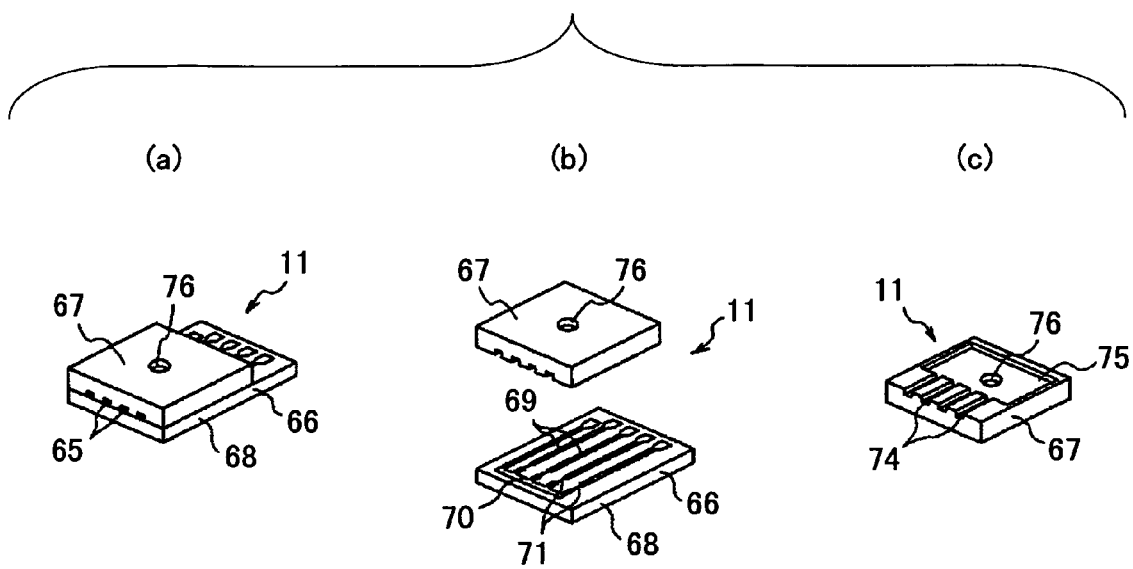
FIG. 7 shows an example of a liquid drop jetting head in a thermal type (bubble type) preferably employed in the apparatus for manufacturing a light emitting type organic thin-film transistor device according to the present invention.

With reference to FIG. 7, another example of a liquid jetting head preferably applicable in the production of a light emitting type organic thin-film transistor device according to the present invention will now be described. This example is a thermal type (bubble type) liquid jetting head. A prime mover for liquid drop jetting is growing function force of film boiling bubbles instantaneously generated in solution.

The liquid jetting head shown there is called an edge shooter type one in which a liquid drop is jetted from an end of the flow path in which solution flows.

In the figure, an example where four nozzles are provided is shown. This liquid jetting head is produced as a result of a heating body substrate 66 and a lid substrate 67 being joined. The heating body substrate 66 is produced as a result of, through a wafer process, on a silicon substrate 68, particular electrodes 69, a common electrode 70 and a heating body 71 which is an energy function part, being produced.

On the other hand, in the lid substrate 67, grooves 74 for producing the flow paths and a recess area 75 for producing a common liquid chamber containing the above-mentioned solution to be introduced to the flow paths are produced. These heating body substrate 66 and the lid substrata 67 are joined as shown in FIG. 7, and the flow paths and the common liquid chamber are produced. In the state in which the heating body substrate 66 and the lid substrate 67 are joined, the heating body 71 is located on a bottom part of the flow path, and at ends of the flow paths, the above-mentioned nozzles 65 are produced for jetting the introduced solution, as liquid drops. The shapes of the nozzles are not limited to rectangles as shown, but may be round shapes. A solution incoming mouth 76 from which the solution is supplied to the common liquid chamber from a supply device (not shown) is provided in the lid substrate 67.

In producing a light emitting type organic thin-film transistor device according to the present invention, light emitting type organic thin-film transistors or electrode patterns are produced by means of a plurality of liquid drops. These are patterns produced as a result of dots being produced in a mutually overlapping manner, or being connected together. Therefore, by using such a multi-nozzle liquid jetting head, a light emitting type organic thin-film transistor device can be very efficiency produced. In this example, the four-nozzle liquid jetting head has been described. However, the number of nozzles is not limited to the four. As the number of nozzles increases, the light emitting type organic thin-film transistor device can be produced more efficiently. However, when the number of nozzles increases, the costs, on the other hand, increases accordingly. Further, a possibility that the nozzles are blocked may increases accordingly. Therefore, the determination should be made in consideration of a balance in the entirety of the apparatus (a balance between the apparatus costs and the light emitting type organic thin-film transistor device producing efficiency).

Figure 8:
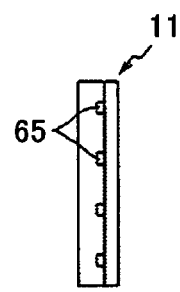
FIG. 8 shows a multi-nozzle type liquid jetting head viewed from a side of a nozzle.
Figure 9:
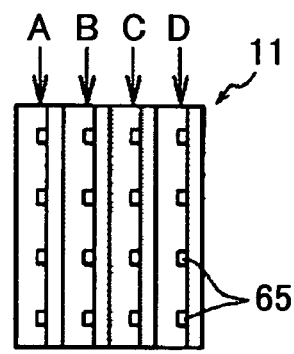
FIG. 9 shows a unit in which a multi-nozzle type liquid jetting head are laminated for each jetted solution.
Figure 10:
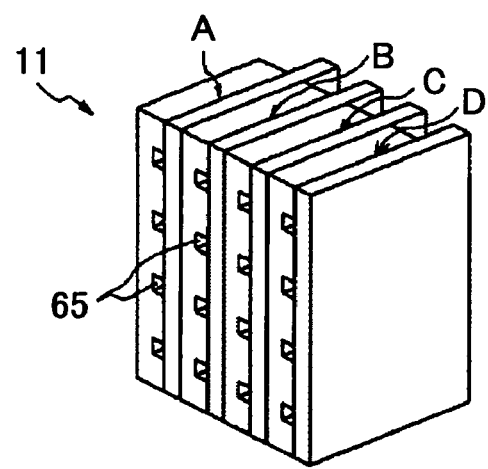
FIG. 10 shows a perspective view of the unit of head.

FIG. 8 shows a view of the multi-nozzle-type liquid jetting head thus produced, viewed from the nozzle side. According to the present invention, such a liquid jetting nozzle is provided for each of solutions as shown in FIG. 9 (the solution of the organic semiconductor material and the solution of the electrodes), and they are mounted on the carriage. FIG. 10 shows a perspective view thereof.

Symbols A, B, C and D are given to the respective multi-nozzle-type liquid jetting heads. These liquid jetting heads A, B, C and D have nozzle parts configured to be apart for each of the liquid jetting heads. Different sorts of solutions (for example, the solution of organic semiconductor material and the solution of electrodes) can be made to jet from the respective liquid jetting heads separately. Alternatively, these may be mounted on separate carriages as separated head units respectively, so that the respective solutions are positively prevented from being mixed on nozzle surfaces.

The light emitting type organic thin-film transistor device producing manufacturing apparatus jets the organic semiconductor material solution and the electrode producing solution, and thus, produces the light emitting type organic thin-film transistor device. Since the plurality of sorts of solutions can be jetted as mentioned above, the light emitting type organic thin-film transistor device can be easily produced from a combination of the electrode pattern producing solution and the organic semiconductor material solution.

Other features of the apparatus for manufacturing/producing the light emitting type organic thin-film semiconductor device according to the present invention will now be described. A study for a better way for liquid drops to be positively adhere to the substrate after they being jetted, and to produce satisfactory patterns, will now be described.

As described above, in the manufacturing apparatus applicable for producing the light emitting type organic thin-film transistor device according to the present invention, the jetting head unit 11 moves with a fixed distance from the substrate 14 in the X/Y directions parallel from the light emitting type organic thin-film transistor group producing surface. Then, patterns or the light emitting type organic thin-film transistor group are produced. That is, the jetting head unit 11 moves parallel to the substrate 14 surface. Alternatively, the substrate 14 itself may instead move with respect to and parallel to the jetting head unit 11.

During this process, high accuracy patterns or light emitting type organic thin-film transistor device groups can be produced when liquid drop jetting is carried out in a condition in which the mutual movement is stopped each time when liquid drop jetting is carried out for producing the pattern or the light emitting type organic thin-film transistor device group. However, this manner may remarkably degrade the productivity. Therefore, the mutual movement is actually not stopped, and solution jetting is carried out continuously in sequence. In this case, the mutual movement speed (for example, the X direction moving speed of the carriage of FIG. 4) should be carefully determined not only from a viewpoint of the productivity but also from a viewpoint of producing high accuracy patterns or functional devices.

These factors were eagerly studied, upon studying for the manufacturing method applied for producing a light emitting type organic thin-film transistor device according to the present invention. As a result, the inventors had found out that the jetting speed should be higher than the mutual movement speed. When the jetting head unit 11 is kept to have a fixed distance from the substrate 11, moves in the X/Y directions mutually with respect to the substrate 14, jets the solution and produces the pattern or the light emitting type organic thin-film transistor device group, a liquid drop of the solution is made to adhere to the substrate 14 at a speed corresponding to a combined vector of the mutual movement speed and the jetting speed. As to the positional accuracy, a liquid drop can be made to adhere at a desired position as a result of a distance between the substrate 14 and the solution jetting nozzle surface of the jetting head unit 11, and the above-mentioned combined vector speed being appropriately taken into account, and timing of jetting begin appropriately selected.

However, even when adherence can be made at a desired position, if the mutual movement speed is too large, the adhering liquid then flows on the substrate 14 due to the mutual movement speed, and thus, the satisfactory shape pattern or light emitting type organic thin-film transistor device group may not be produced. Upon studying for the manufacturing apparatus applied for producing a light emitting type organic thin-film transistor device according to the present invention, this point was especially taken into account. An example of a result of the study will now be described. In this example, the apparatus of FIG. 4 was used, the X-direction movement speed of the carriage 12, and the jetting speed of the jetting head unit 11 were changed each time, and a study was made as to whether or not a satisfactory pattern shape could be obtained.

Figure 11:
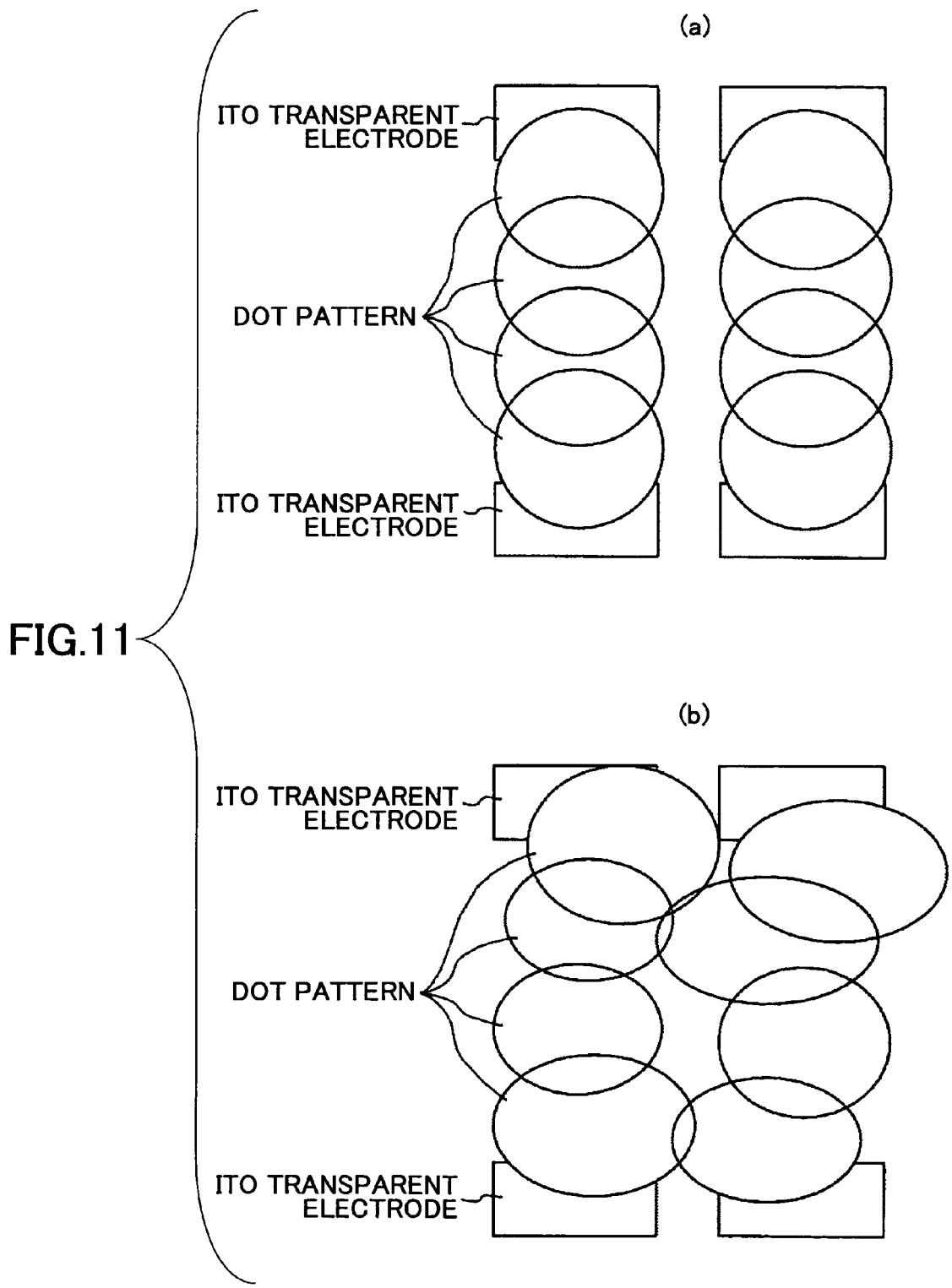
FIG. 11 shows an example of a test pattern used when a condition is found out for producing a satisfactory pattern by means of the apparatus for manufacturing a light emitting type organic thin-film transistor device according to the present invention.

FIG. 11 shows examples of patterns used. In this example, Ag fine particle included solution was jetted, wiring patterns were produced from mutually connected dots of the above-mentioned solution between two rows of close electrodes (ITO transparent electrodes), and a state of the pattern produced was evaluated. Specifically, a microscope was applied to observe the produced patterns, and determination was made for satisfactory/unsatisfactory (○/X). FIG. 11 (a) corresponds to ○. FIG. 11 (b) corresponds to X. That is, in a case of FIG. 11 (b), each dot pattern does not have a satisfactory circle shape, has an elongate circle shape, adheres at a position different from a desired position, or connects to a dot of an adjustment row.

In addition to such evaluation, a resistance value between top and bottom ITO transparent electrodes was measured, and thus, a line disconnection due to unsatisfactory dot position or a resistance shift due to connection with adjacent row, was evaluated. In a measurement result below, ○ denotes a desired resistance value. X denotes a resistance value different from the desired one.

Details of the experiment conditions are as follows: A substrate used was a glass substrate with transparent ITO electrodes. The above-mentioned Ag fine particle included solution (specifically, a fine particle diameter: 0.005 μm) was combined with the jetting head (nozzle diameter: 5 μm) of FIG. 5 described above, and pattern of FIG. 11 were produced. FIG. 11 shows a state, for the purpose of simplification, in which four dots are used to fill in between the pair of the ITO transparent electrodes. However, actually, a vertical row of approximately hundred dots of approximately φ 8 μm were jetted with a pitch of approximately 4 μm to connect the top and bottom ITO transparent electrodes (inter-electrode distance: 0.4 mm). Further, adjacent thereto, the same ITO electrodes, and the same patterns were produced with a center-to-center distance of 12 μm.

The jetting head used was of a piezo type, had 64 nozzles and their arranging density was 100 dpi. The jetting head and the substrate carried out mutual movement (i.e., the substrate was fixed, while the jetting head was carried by a carriage for scanning). The movement was controlled on the μm order. Also, jetting timing was controlled. Thus, as mentioned above, dot adherence with the pitch of 4 μm pattern were produced with the center-to-center distance kept of 12 μm.

In order to change the jetting speed, a driving voltage input to the piezo device for liquid jetting was changed between 15 through 22 V. A driving frequency was 12 kHz. In the jetting head employing the piezo device, the jetting speed can be changed as a result of the input voltage to the piezo device being changed. However, a mass of the jetted drop would change also simultaneously. Therefore, by controlling the driving waveform (a rising up waveform and a decaying down waveform including a drawing jetting manner) so that only the jetting speed was changed.

Figure 12:
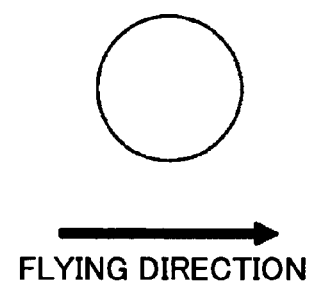
FIG. 12 illustrates an example of a liquid drop flying shape when a liquid drop is jetted by means of a force from a mechanical displacement in the jetting head used in the apparatus for manufacturing a light emitting type organic thin-film transistor device according to the present invention.

Further, a shape of a drop, when it was jet and flied in a condition the same as that of actual pattern production, was observed. Then, the driving waveform was controlled so that the shape became approximately spherical immediately before (2 mm in this example) adhering the substrate surface (see FIG. 12). Even though an accurate spherical shape was not obtained, a rod shape long in a flying direction was obtained, where the length could be made within three times of the diameter as a result of the driving waveform being well controlled (l≦3d) (see FIG. 13). Further, at this time, the driving condition (driving waveform) was selected so that minute drops were prevented from accompanying subsequent in the flying direction to a body drop (see FIG. 14) as will be described later. The actual result was as follows:

TABLE 1

| Experiment resistance value No. | jetting speed Vj(m/s) | carriage X-direction moving speed Vc(m/s) | pattern produced state |
|---|---|---|---|
| 1 | 3 | 1 | ○ |
| 2 | 3 | 2 | ○ |
| 3 | 3 | 3 | X |
| 4 | 3 | 4 | X |
| 5 | 5 | 1 | ○ |
| 6 | 5 | 2 | ○ |
| 7 | 5 | 3 | ○ |
| 8 | 5 | 4 | ○ |
| 9 | 5 | 5 | X |
| 10 | 5 | 6 | X |
| 11 | 7 | 2 | ○ |
| 12 | 7 | 3 | ○ |
| 13 | 7 | 4 | ○ |
| 14 | 7 | 5 | ○ |
| 15 | 7 | 6 | ○ |
| 16 | 7 | 7 | X |
| 17 | 7 | 8 | X |
| 18 | 10 | 4 | ○ |
| 19 | 10 | 6 | ○ |
| 20 | 10 | 8 | ○ |
| 21 | 10 | 10 | X |
| 22 | 10 | 12 | X |
| 23 | 10 | 14 | X |
| 24 | 12 | 4 | ○ |
| 25 | 12 | 6 | ○ |
| 26 | 12 | 8 | ○ |

TABLE 1-continued

| Experiment resistance value No. | jetting speed Vj(m/s) | carriage X-direction moving speed Vc(m/s) | pattern produced state |
|---|---|---|---|
| 27 | 12 | 10 | ○ ○ |
| 28 | 12 | 12 | x x |
| 29 | 12 | 14 | x X |

From the above result, it is seen that, when the carriage X-direction speed is more than the jetting speed, no satisfactory pattern can be produced, and also, inter-electrode resistance value becomes one different from the desired one. In other words, it is seen that, in the manufacturing apparatus applied for producing a light emitting type organic thin-film transistor device according to the present invention, when a light emitting type organic thin-film transistor device is produced by a manner of, with the use of the jetting head employing the piezo device, liquid drops of the organic semiconductor material included solution being provided to the substrate, and being dried, the speed of the liquid drops jetted from the jetting head should be higher than the mutual movement speed between the jetting head and the substrate.

Furthermore, drop flying conditions of this example were such that, as mentioned above, the driving condition (driving waveform) was determined such that, a plurality of minute drops should be prevented from accompanying subsequent to the flying body drop. As a result, these plurality of minute drops, otherwise generated, could be completely prevented from adhering to unexpected positions. Thus, very satisfactory patterns could be produced.

Figure 13:
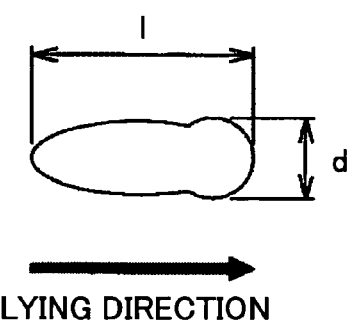
FIG. 13 illustrates another example of a liquid drop flying shape when a liquid drop is jetted by means of a force from a mechanical displacement in the jetting head used in the apparatus for manufacturing a light emitting type organic thin-film transistor device according to the present invention.
Figure 14:
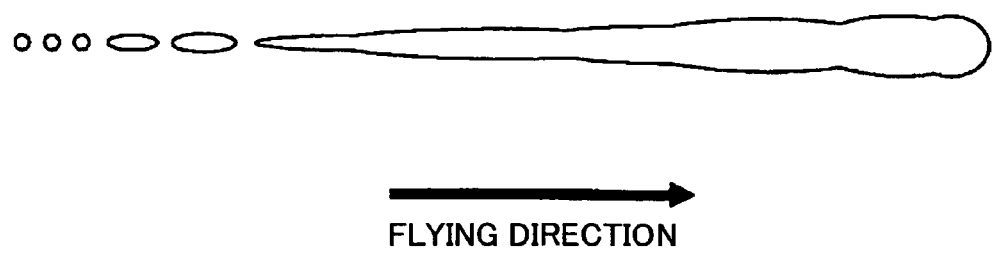
FIG. 14 illustrates an example of a liquid drop flying shape when a liquid drop is jetted by means of a force from film boiled bobbles in the jetting head used in the apparatus for manufacturing a light emitting type organic thin-film transistor device according to the present invention.

Further, even though a rod like flying drop long along the flying direction was obtained, the length of the flying drop could be controlled by the driving waveform control to be within three times of the diameter ($l \geq 3d$) (see FIG. 13). As a result, a dot produced became to have a shape near to a complete round. As a result, a satisfactory pattern could be produced.

As another method of producing the light emitting type organic semiconductor layer, a vacuum deposition method, a molecular ray epitaxial growth method, an ion cluster beam method, a low energy ion beam method, an ion plating method, a CVD meted, a spattering method, a plasma polymerization method, an electrolytic polymerization method, a chemical polymerization method, and so forth, may be used, depending on material to actually use.

As a film thickness of these organic semiconductor layers, although no special limitation exists, characteristics of the light emitting transistor may greatly depend on the film thickness of the organic semiconductor layer. The film thickness depends on each particular organic semiconductor. However, generally speaking, not more than 1 μm, specifically, 10 through 300 nm is preferable.

As electrode material of the gate electrode, the source electrode and the drain electrode of the light emitting type organic transistor device according to the present invention, platinum, gold, silver, nickel, chrome, copper, iron, tin, antimonial lead, tantalum, indium, palladium, tellurium, rhenium, iridium, aluminum, ruthenium, germanium, molybdenum, tungsten, tin oxide stibium, indium tin oxide (ITO), fluorine doped zinc oxide, zinc, carbon, graphite, glassy carbon, silver paste and carbon paste, lithium, beryllium, sodium, magnesium, potassium, calcium, scandium, titanium, manganese, zirconium, gallium, niobium, sodium, sodium-potassium alloy, magnesium, lithium, aluminum, magnesium/gold mixture, magnesium/copper mixture, magnesium/silver mixture, magnesium/aluminum mixture, magnesium/indium mixture, aluminum/aluminum oxide mixture, lithium/aluminum mixture and so forth may be used. When light emitted is taken out from the side of the electrode, a transparent electrode should be provided of transparent material such as ITO.

Other than using such material alone, a combination of a plurality thereof may be used. Specifically, a two-layer configuration such as that of a combination of magnesium/gold mixture and gold, a combination of magnesium/copper mixture and gold, a combination of magnesium/silver mixture and gold, a combination of magnesium/aluminum and gold, a combination of magnesium/indium mixture and gold, a combination of aluminum/aluminum oxide and gold. a combination of a lithium/aluminum mixture and gold, a combination of magnesium and gold, a combination of aluminum and gold, a combination of chrome and gold or such may be used. A three-layer configuration such as that of a combination of magnesium/gold mixture, gold and aluminum, a combination of magnesium/copper mixture, gold and aluminum, a combination of magnesium/silver mixture, gold and aluminum, a combination of magnesium/aluminum mixture, gold and alumiju8im, a combination of magnesium/indium mixture, gold and aluminum, a combination of aluminum/aluminum oxide, gold and aluminum, a combination of lithium/aluminum mixture, gold and aluminum, a combination of magnesium, gold and aluminum, a combination of aluminum, gold and aluminum, a combination of chrome, gold and aluminum or such may be used.

Other than such electrically conductive metal material, silicon semiconductor material may be used instead. Especially, for a case where the gate electrode 6 has a function of supporting member as shown in FIG. 3, n+silicon semiconductor material may be preferably used as the gate electrode 6.

Alternatively, well-known polymer improved in its electrical conductive by means of doping or such, for example, electrically conductive polyaniline, electrically conducive polypyrrole, electrically conductive polythiophene (complex of polyethylene dioxy thiophene and polystyrene sulphonate or such) may be preferably used.

As material as the source electrode and the drain electrode, among materials mentioned above, those having low electric resistance on a contact surface with the semiconductor layer are preferable. For a case of p-type semiconductor, especially, platinum, gold, silver, ITO, electrically conductive polymer and carbon are preferable.

These electrode layers and patterns are produced by a method in combination of a film producing method such as a vacuum deposition method, a molecular epitaxial growth method, an ion cluster beam method, a low energy ion beam method, an ion plating method, a CVD method, a spattering method, a plasma polymerizing method, a chemical polymerization method, a spray coating method, a spin coating method, a blade coating method, a dip coating method, a coating method, a role coating method, a bar coating method, a die coating method, or such, and a photolithography/etching method, or a lift off method.

Alternatively, a non-contacting direct producing method may be used by using the liquid jetting principle described above for producing the light emitting type organic semiconductor material layer. Further, a printing method such as letterpress printing, intaglio printing, litho printing, screen printing may be used.

When the source electrode, the drain electrode and so forth are produced of these solution or paste material, flowable electrode material such as solution, paste, ink, dispersion liquid or such including the above-mentioned conductive metal may be used. Thereamong, flowable electrode material including electrically conductive polymer, or, metal fine particles including platinum, gold, silver, or copper is preferable. Further, as solvent or dispersion medium, solvent or dispersion medium including water in the ratio of more than 60% or more preferably more than 90% for the purpose of reducing damage to the organic semiconductor may be used.

As the flowable material including metal fine particles, material obtained from dispersion metal fine particles having particle diameter of 1 through 50 nm, more preferably, 1 through 10 nm in water or any other dispersion medium which is organic solvent, with the use of dispersion stabilizer if necessary, may be used.

As material of the metal fine particles, platinum, gold, silver, nickel, chrome, copper, iron, tin, stibium, lead, tantalum, indium, palladium, tellurium, rhenium, indium, aluminum, ruthenium, germanium, molybdenum, tungsten, zinc or such may be used.

As a method of producing the dispersion of the metal fine particles, a physical producing method such as a gas evaporation method, spattering method, metal moisture combining method or such, a chemical producing method such as a colloid method, a coprecipitation method or such in which metal ions are reduced in liquid phase and metal fine particles are produced, may be used. However, preferable dispersion is metal fine particle dispersion produced by means of the colloid method or the gas evaporation method.

As the gate insulation layer of the organic thin-film transistor according to the present invention, various insulation films may be used. However, especially, inorganic oxide film having high dielectric constant is preferable. As the inorganic oxide, silicon oxide, aluminum oxide, tantalum oxide, titan oxide, tin oxide, vanadium oxide, barium titanate strontium, zirconium acid barium titanate, zirconium acid titanate lead, lead titanate lanthanum, strontium titanate, barium titanate, barium fluoride magnesium, bismuth titanate, strontium titanate bismuth, strontium tantalite bismuth, bismuth tantalate niobate, trioxide yttrium, and so forth may be used. Thereamong, silicon oxide, aluminum oxide, tantalum oxide and titanium oxide are preferable. Also, inorganic nitride such as silicon nitride, aluminum nitride or such are preferable.

As a method of producing the above-mentioned film, a dry process such as a vacuum deposition method, a molecular ray epitaxial growth method, an ion cluster beam method, a low energy ion beam method, an ion plating method, a CVD method, a spattering method, an atmosphere plasma method, a coating method such as spray coating method, a spin coating method, a blade coating method, dip coating method, a casting method, a roll coating method, a bar coating method, a die coating method, a wet process such as a method of patterning such as printing or ink jet, may be used. Any thereof may be used depending on material to use actually. Alternatively, for a case where the silicon semiconductor substrate has a supporting function and a gate electrode function (FIG. 3), a silicon oxide film may be produced as result of thermally oxidizing the silicon semiconductor substrate.

As the wet process, a method in which, liquid in which the inorganic oxide fine particles are dispersed in any organic solvent or water with the use of surfactant or dispersion coadjuvant if necessary, may be carted and dried, or, a so-called sol-gel method in which oxide precursor such as alcoxide solution is located and dried, may be used.

Thereamong, the atmosphere plasma method is most preferable. Further, it is preferable that the gate insulating layer is made of anodized film or made of anodized film and an insulating film. The anodized film may preferably be one which has undergone a sealing process. The anodized film may be produced as a result of metal which can be anodized being anodized by a well-known method.

As the anodizable metal, aluminum and tantalum may be used. A specific method of anodizing processing is not limited, and a well-known method may be used. As a result of carrying out anodization processing, an oxide film may be produced. As electrolyte used in the anodization processing, any one may be used as long as it can produce a porous oxide film. Generally speaking, sulfuric acid, phosphoric acid, oxalic acid, chromic acid, boric acid, sulfuric acid, benzene sulfuric acid or such, mixed acid in combination of some thereof, or salt thereof, may be used. Processing conditions of the anodization processing may depend on electrolyte to use. Generally speaking, a concentration of the electrolyte should be within a range of 1 through 80 weight %, temperature of the electrolyte should be within a range of 5 through 70° C., an electric current density should be within a range of 0.5 through 60 A/dm$^2$, a voltage should be within a range of 1 through 100 V, an electrolytic time should be within a range of 10 seconds through 5 minutes. Preferable anodization processing is such that water solution of sulfuric acid, phosphoric acid or boric acid is used as electrolyte, and a direct current power source is used. However, an alternative current power source may also be used. Concentration of these acids should be preferably 5 through 45 weight %. It is preferable that temperature of the electrolyte is 20 through 50° C., the electric current density is 0.5 thorough 20 A/dm$^2$, and electrolyzing processing is carried out for 20 through 250 seconds.

As the organic compound film, polyimide, polyamide, polyester, polyacrylate, photo-curing resin such as photo-radical polymer, photo-cation polymer or such, copolymer including acrylonitrile ingredient, polyvinyl phenol, polyvinyl alcohol, novolak resin, cyanoethylpluran or such may be used.

As a method of producing the organic compound film, the above-mentioned wet process is preferable.

The inorganic oxide film and the organic oxide film may be used in combination. A thickness of these insulating films is, generally speaking, 50 nm through 3 μm, preferably 100 nm through 1 μm.

When the organic semiconductor is produced on the gate insulating layer, surface treatment may be carried out on a surface of the gate insulating layer. Self-organized orientation film of silane coupling agent such as octadecyltrichlorosilane, trichloromethylsilazane, alkane phosphoric acid, alkane sulfuric acid, alkane carbonic acid, or such, may be preferably used.

For a case where the gate insulating layer is configured such that, as described above, light emitted is taken out through the gate insulting layer, the gate insulating layer may be made of, for example, translucent material such as silicon oxide, whereby the light can be effectively taken out.

One preferable example of the supporting body is resin. In a configuration example shown in FIGS. 1, 2 or such, a plastic film sheet may be used. As the plastic film, for example, a film or such made of polyethylene terephthalate (PET), polyethylene naphthalate (PEN), polyether sulfone (PES), polyether imide, polyether ether ketone, polyphenyl sulfide, polyallylate, polyimide, polycarbonate (PC), cellulose triacetate (TAC), cellulose acetate propionate (CAP) or such may be used. By using the plastic film, it is possible to reduce the weight in comparison to a case of using a glass substrate.

Also, it is possible to improve portability, and further, it is possible to improve durability against impact. Further, since it has flexibility, flexible light emitting type organic thin-film transistor device sheet can be achieved. Thereby, it can be applied for a use such that it is used in a condition in which it is bent.

Also in this case, in order to achieve a configuration such that light emitted is taken externally through a substrate or a sheet as the supporting body, translucent material is selected therefor from among the above-mentioned materials, whereby light can be effectively taken out therethrough.

Figure 15:
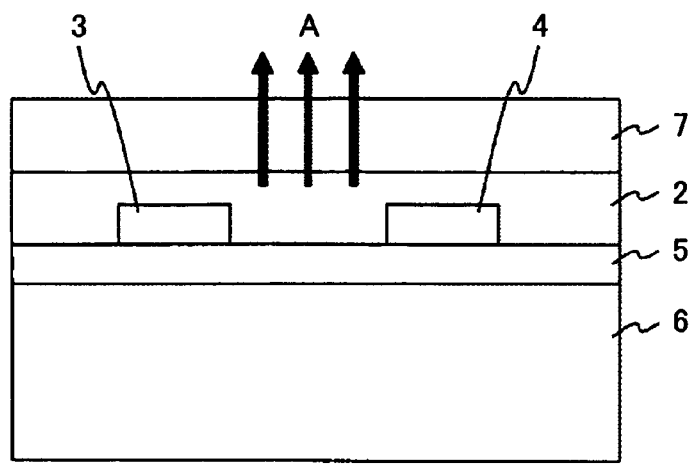
FIG. 15 shows an example of a configuration of a light emitting type organic thin-film transistor device according to the present invention.

The device protection layer 7 made of translucent material may be provided on the light emitting type organic thin-film transistor device according to the present invention. As the device protection layer, the above-described inorganic oxide or inorganic nitride may be used, and, preferably, may be produced by the above-mentioned atmospheric plasma method. Especially, silicon oxide which is translucent material is preferable. Thereby, oxide, vapor or such in the air, can be cut off, and thus, the organic semiconductor material can be sealed therefrom. Thus, durability of the thin-film transistor device can be improved, and also, light emitted from the organic semiconductor material can be effectively taken out. FIG. 15 shows a typical device configuration example (sectional view). In this configuration, light emitted from the organic semiconductor layer 2 can be taken out in a direction of an arrow A through the translucent device protection layer 7.

Figure 16:
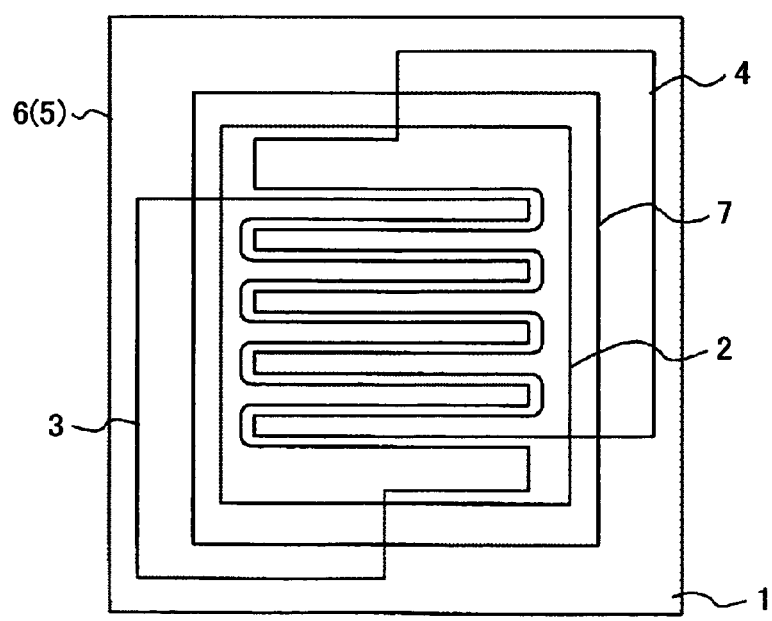
FIG. 16 shows a plan view of an example of the configuration of the light emitting type organic thin-film transistor device according to the present invention.
Figure 17:
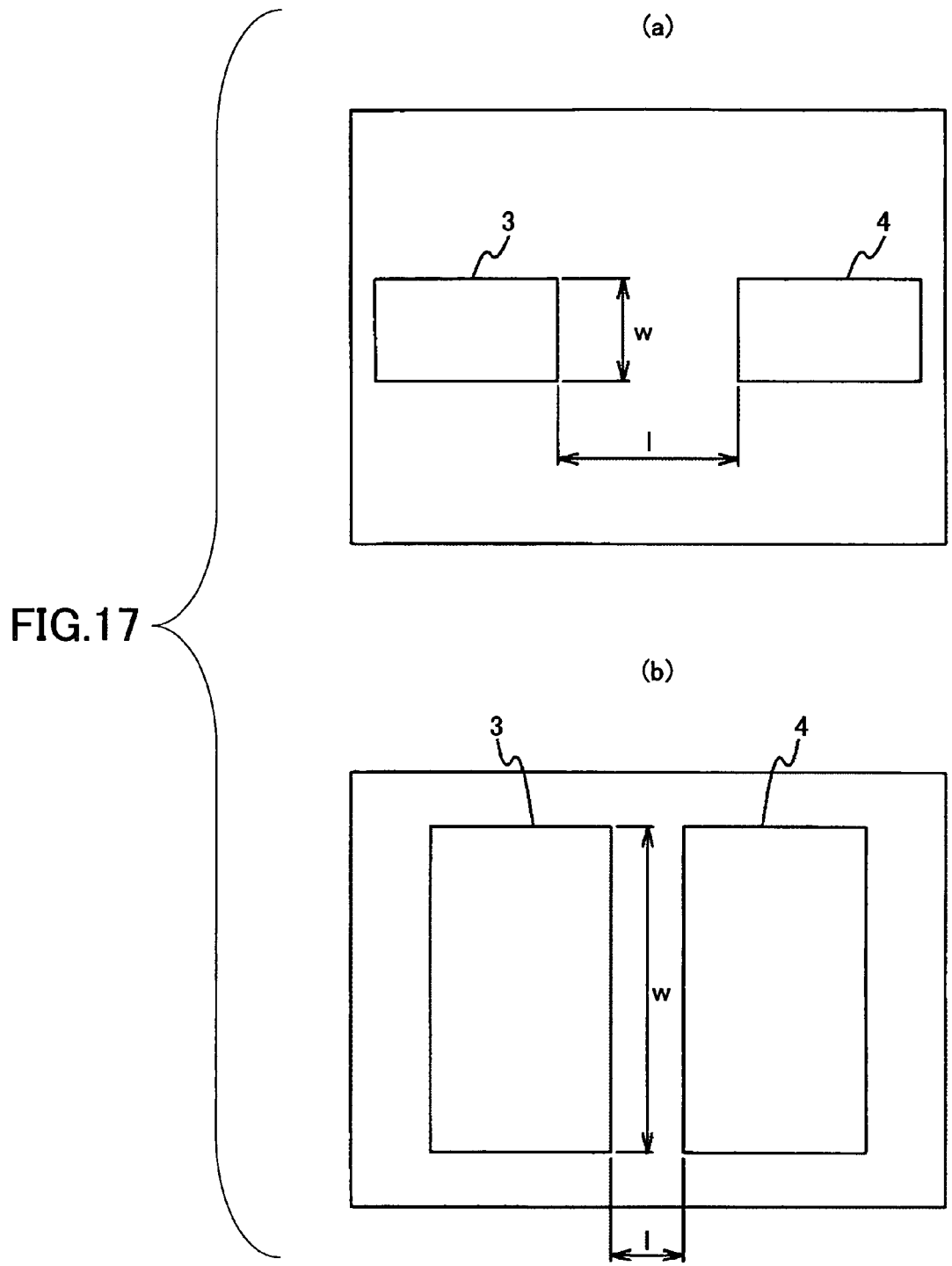
FIG. 17 illustrates an inter-electrode distance l between a source electrode and a drain electrode of a light emitting type organic transistor device according to the present invention, and an electrode length w of an area in which the source electrode and the drain electrode face one another.

For a more specific device structure of the light emitting type organic thin-film transistor device, description will now be made with reference to FIG. 16 showing a variant configuration example of the bottom gate type. FIG. 16 shows a plan view. A sectional configuration is the same as that shown in FIG. 15. However, the dimensions do not match. FIG. 17 shows a pattern shape and main dimensions of the source electrode 3 and the drain electrode 4.

This example is an organic transistor configured such that, an organic semiconductor layer 2 made of organic semiconductor material, for example, described above, is laminated in such a manner that the entirety of the pair of the source electrode 3 (first electrode) and the drain electrode 4 (second electrode) are disposed to be apart with a predetermined distance on a gate insulating layer 5, and the gate electrode 6 (third electrode) are provided in an area in which the organic semiconductor layer 2 is provided, through a gate insulating layer 5 located below. Between the source electrode 3 and the drain electrode 4, such a voltage is applied that the organic semiconductor material emits light. Further, a voltage is applied to the gate electrode 6, so that turning on/off of the light emission or a light emission amount, is controlled. At this time, it was found out that, by increasing an electrode length of the source electrode 3 and the drain electrode 4 in an area in which both face one another, light was emitted more efficiently.

This matter will now be described with reference to FIG. 17 showing a general view of an essential part. In FIG. 17, in order to simplify the configuration, only patterns of the source electrode 3 and the drain electrode 4 are shown. (a) shows a case where an electrode length w of an area in which the source electrode 3 and the drain electrode 4 face one another is shorter than an inter-electrode distance 1 between the source electrode 3 and the drain electrode 4 (l>w). (b) shows a case where the electrode length w of an area in which the source electrode 3 and the drain electrode 4 face one another is longer than the inter-electrode distance 1 between the source electrode 3 and the drain electrode 4 (l<w).

In the case of FIG. 17 (a), the light emission efficiency is insufficient when a voltage between the source electrode 3 and the drain electrode 4 is not increased. In contrast thereto, in the case of FIG. 17 (b), satisfactory light emission can be obtained even when the voltage is reduced, i.e., with a reduce energy.

Figure 18:
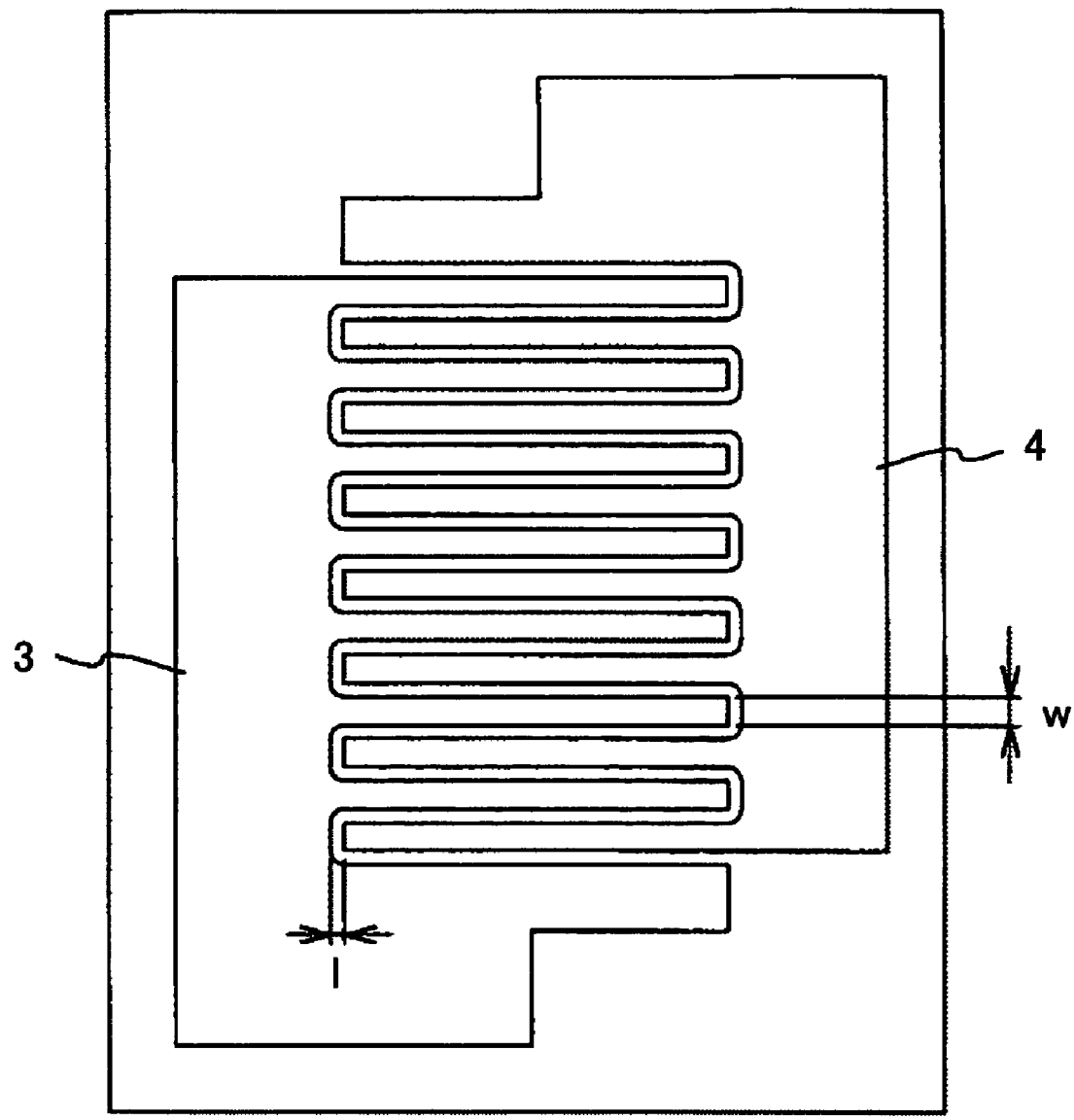
FIG. 18 shows one example of a pattern shape such that a ratio (l/w) between the inter-electrode distance l between a source electrode and a drain electrode of a light emitting type organic transistor device according to the present invention, and the electrode length w of an area in which the source electrode and the drain electrode face one another can be made lager.

More preferably, the electrode patterns are produced in such a manner that the ratio between both (l/w) may be 1/2000 through 1/2. In this case, simple rectangular patterns as those shown in FIG. 17 (b) can do well. However, more preferably, a pattern shape such that the ratio between both can be increased may be used. FIG. 18 shows an example of such a pattern shape.

In this example, ends at which the patterns of the source electrode 3 and the drain electrode 4 face one another have a comb tooth shape. There, the comb teeth are configured such that they pass each other as shown. Thereby, the electrode length w along which the source electrode 3 and the drain electrode 4 face can be effectively increased. Although not shown, a peripheral length of the comb teeth along which they face corresponds to the electrode length w of an area in which the source electrode 3 and the drain electrode 4 face one another. l shown corresponds to the inter-electrode distance between the source electrode 3 and the drain electrode 4.

Figure 19:
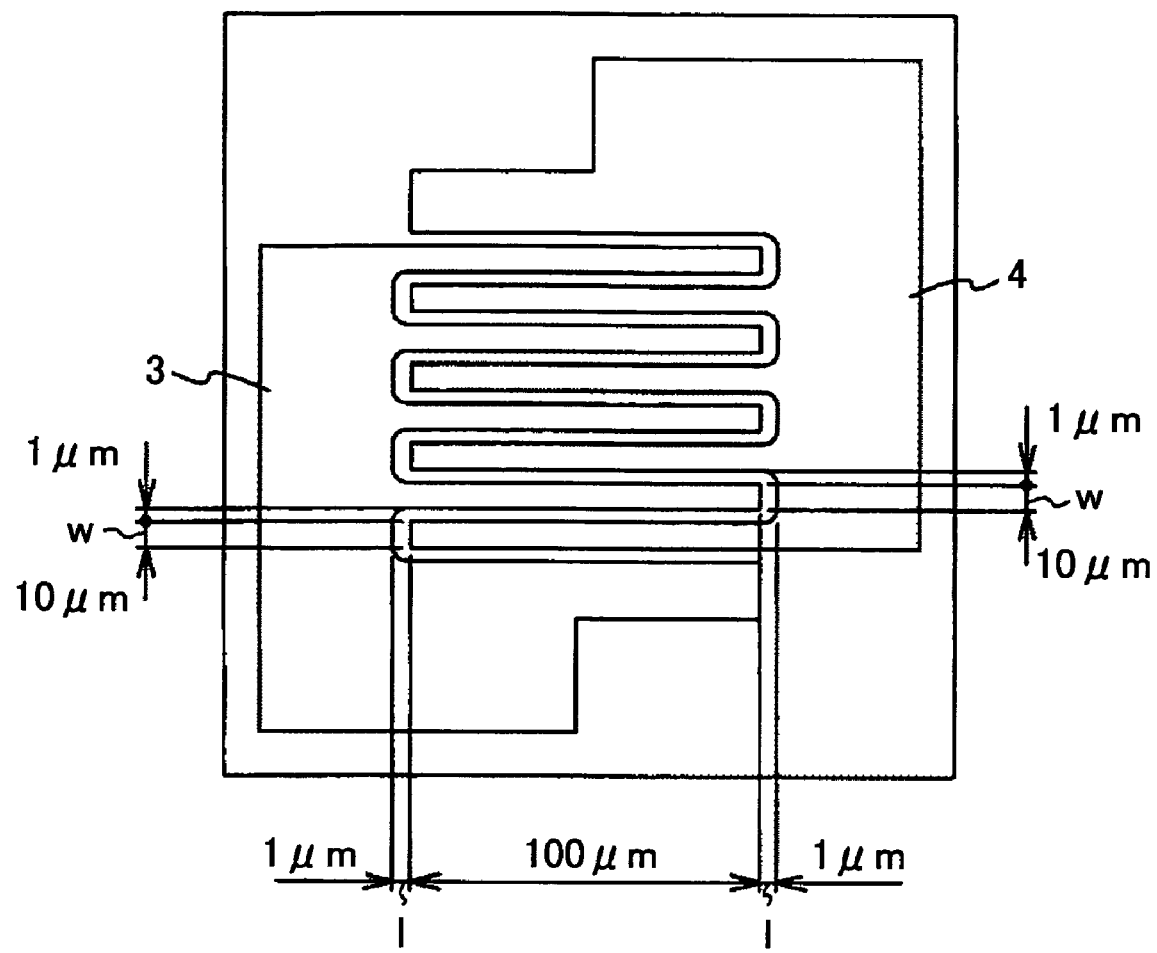
FIG. 19 shows an electrode pattern shape of the example of the configuration of FIG. 16 and main dimensions thereof.

FIG. 19 shows one example, different from the example of FIG. 18, showing pattern shapes and specific dimensions of the source electrode 3 and the drain electrode 4. In this example, the numbers of comb teeth of both electrodes 3 and 4 are not equal to one another. However, in this example, satisfactory light emission is obtained. In this example, the inter-electrode distance l between the source electrode 3 and the drain electrode 4 is 1 µm, the electrode length w of an area in which the source electrode 3 and the drain electrode 4 face one another is approximately 989 µm (=100 µm×9+10 µm×8+1µ×9), and thus, a ratio therebetween (l/w) is approximately 1/1000.

Figure 20:
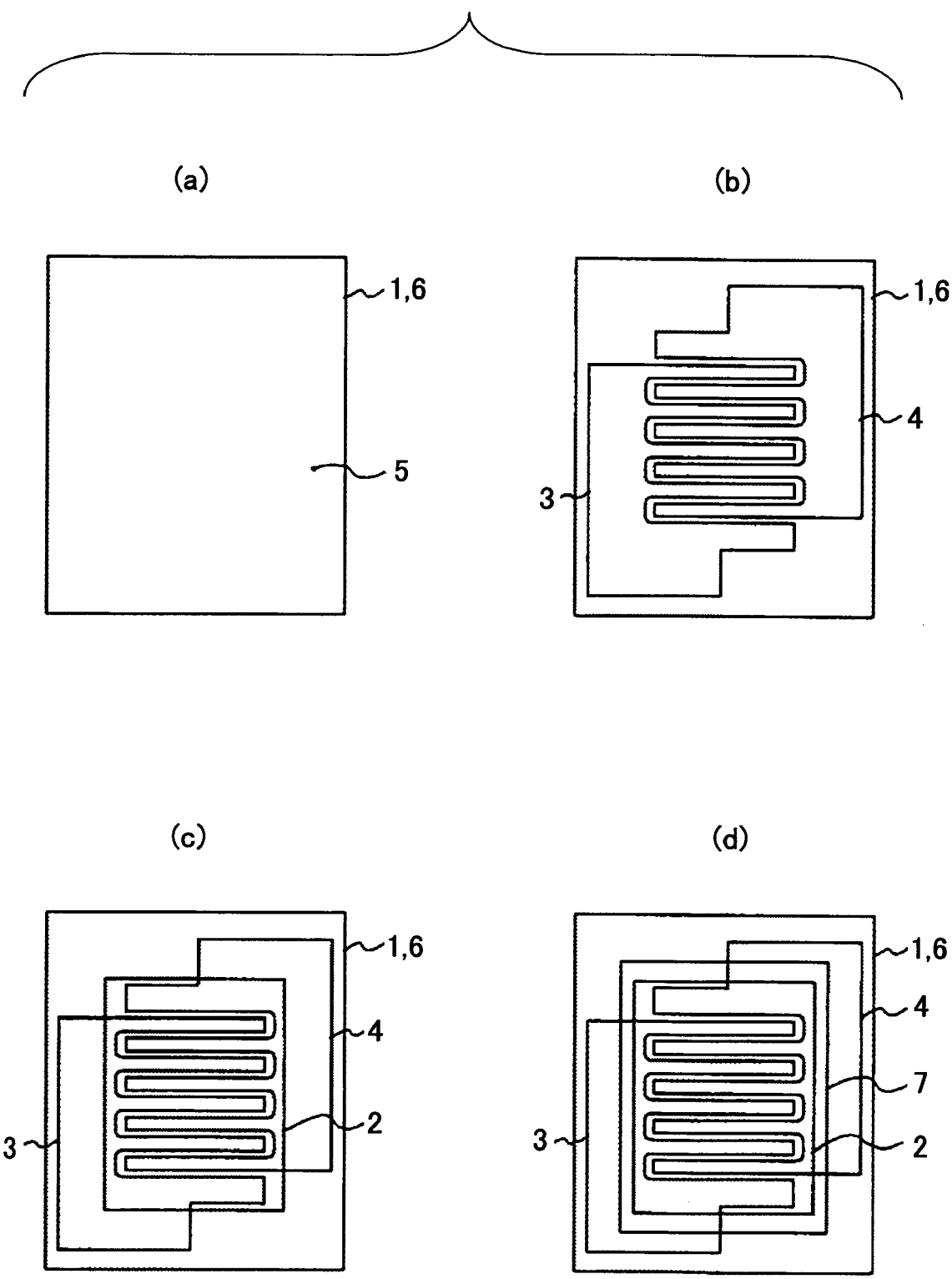
FIG. 20 shows a manufacturing process of the example of the configuration of FIG. 16.

This device is produced by a process such as that shown in FIG. 20, for example. (a) shows a substrate acting both a supporting body 1 and gate electrode 6, made of Si semiconductor substrate, and silicon oxide is provided on its surface as a gate insulating layer 5. Thereon, by means of processes of thin film production→photolithography→etching, a source electrode 3 and a drain electrode 4 having patterns shown are produced ((b)). Next, an organic semiconductor layer 2 is produced ((c)), and finally, a device protection layer 7 is produced ((d)). Thus, production is completed.

In this example, the substrate acts as both the supporting body 1 and the gage electrode 6. Therefore, the Si semiconductor substrate is used. However, in order to produce a very large number of light emitting type organic thin-film transistor devices in a very large area as described later, the costs can be reduced by using a glass substrate, a ceramic substrate or such, for the supporting body 1. Further, as mentioned above, a plastic film sheet may also be used. Further in such a case, silicon oxide which is translucent materiel may be used as the gate electrode 5, and the glass substrate or the plastic film sheet may be transparent. Further, also translucent material such as ITO may be used as the gate electrode not shown. Thereby, light emitted can be effectively taken out from the side of the supporting body 1 (in this example, the member as the gate electrode 6) opposite to the arrow A of FIG. 15.

Figure 21:
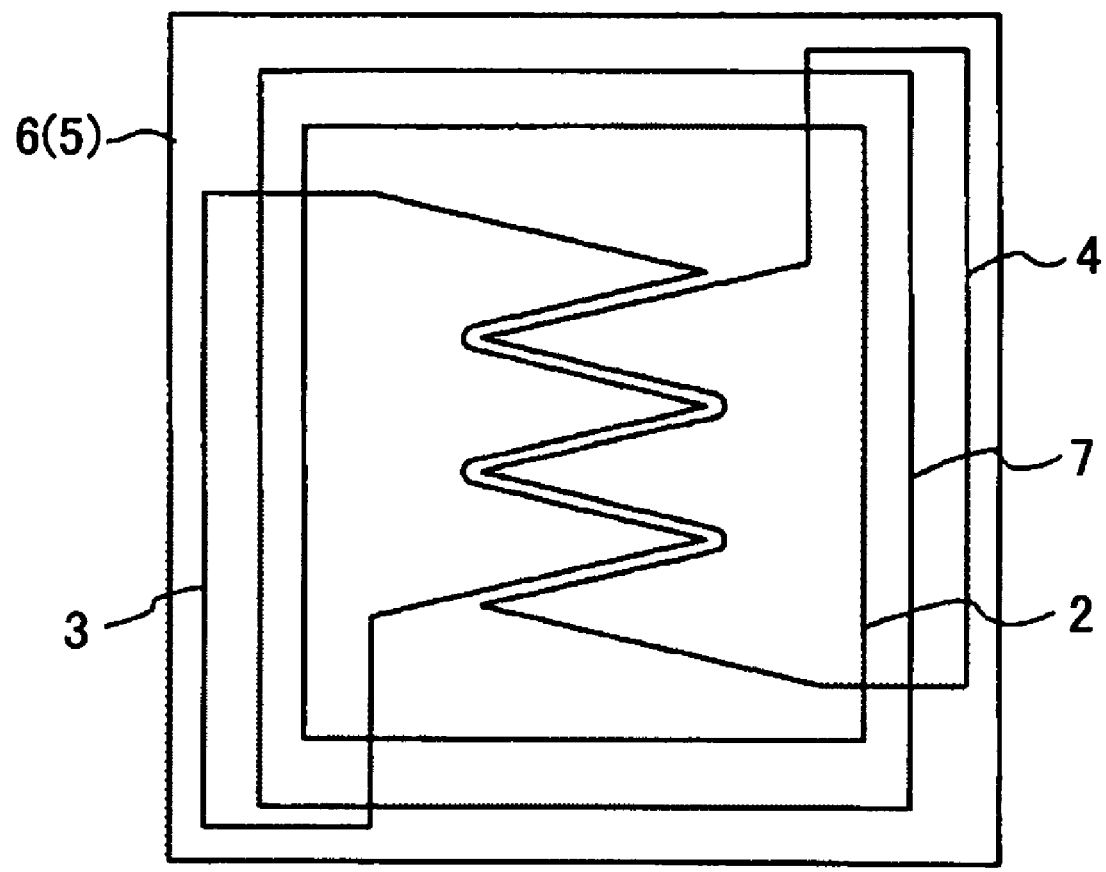
FIG. 21 shows an example of another electrode pattern.

FIG. 19 shows the pattern shapes and main dimensions. However, it is not necessarily required to limit to them. FIG. 21 shows another electrode pattern example.

In FIGS. 15 and 16, a reference numeral 6 denotes a Si semiconductor substrate, having a thickness of 0.6 mm, on which, as the gate electrode 6, silicon oxide is produced for a thickness of approximately 350 nm. This member acts both as the supporting body 1 and the gate electrode 6. 3, 4 denote the source electrode 3 and the drain electrode 4, respectively, having a two-layer structure in which, after 15 nm of magnesium/gold mixture (in a ratio of 1:1) is produced, 30 nm of gold is produced. The patterns shown were produced by means of processes of photolithography→etching after the electrode material thin-film was produced.

FIG. 19 shows electrode dimensions and so forth of an actual experimental product. However, the present invention should not be limited to these dimensions. In this example, the entirety of a distance (channel width) of an area (channel length: 1 μm in this example), in which the distance between the source electrode 3 and the drain electrode 4 is uniform, is approximately 989 μm (=100 μm×9+10 μm×8 and 1 μm×9).

The organic semiconductor layer 2 was obtained as a result of, polymer (described above) expressed by the following chemical formula for example,

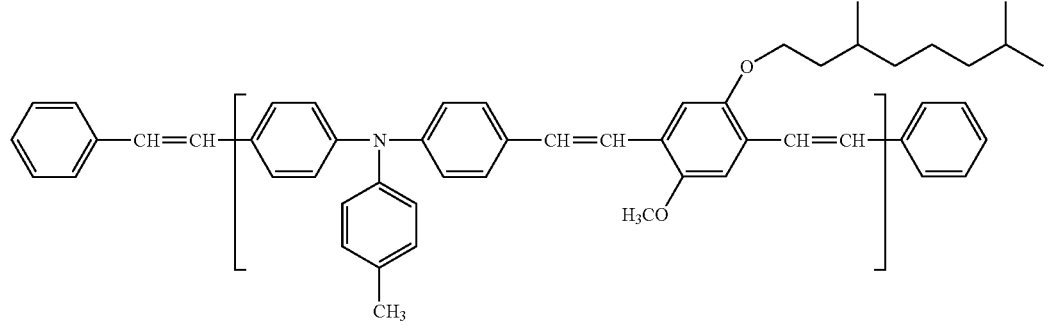

in which 1.8 w % of Rubrene was added, being dissolved in dimethyl carbonate, and, then, the thus-obtained solution being coated on the above-mentioned source electrode 3 and the drain electrode 4, by means of the above-mentioned light jetting principle, without contact, in such a manner of so-called 'solid jetting' which terms is one used in the ink-jet recording technique. A thickness of the thus-produced organic semiconductor layer 2 was approximately 120 nm measured after it was dried.

After drying the organic semiconductor layer 2, silicon oxide was, as the device protection layer 7, by means of spattering, produced on the entire surface so that the organic semiconductor layer 2 could be completely sealed, for a thickness of 0.5 μm. Thus the light emitting type organic thin-film transistor device was completed.

Next, other features of the present invention will be described. As described above, in the present invention, an electrode length w of an area of mutually facing source electrode 3 and drain electrode 4 is larger than an inter-electrode distance l therebetween. More preferably, a ratio (l/w) of the inter-electrode distance l between the source electrode 3 and the drain electrode 4 and the electrode length w of the area in which the source electrode 3 and the drain electrode 4 face one another is made 1/2000 through 1/2. Thereby, the light emission can be more efficiently carried out. In other words, in FIG. 17, electrode patterns are produced in such a manner that a light emission area (the organic semiconductor material layer located between the source electrode 3 and the drain electrode 4) may become an elongate shape, and thus, the above-mentioned ratio (l/w) may be 1/2000 through 1/2.

Figure 22:
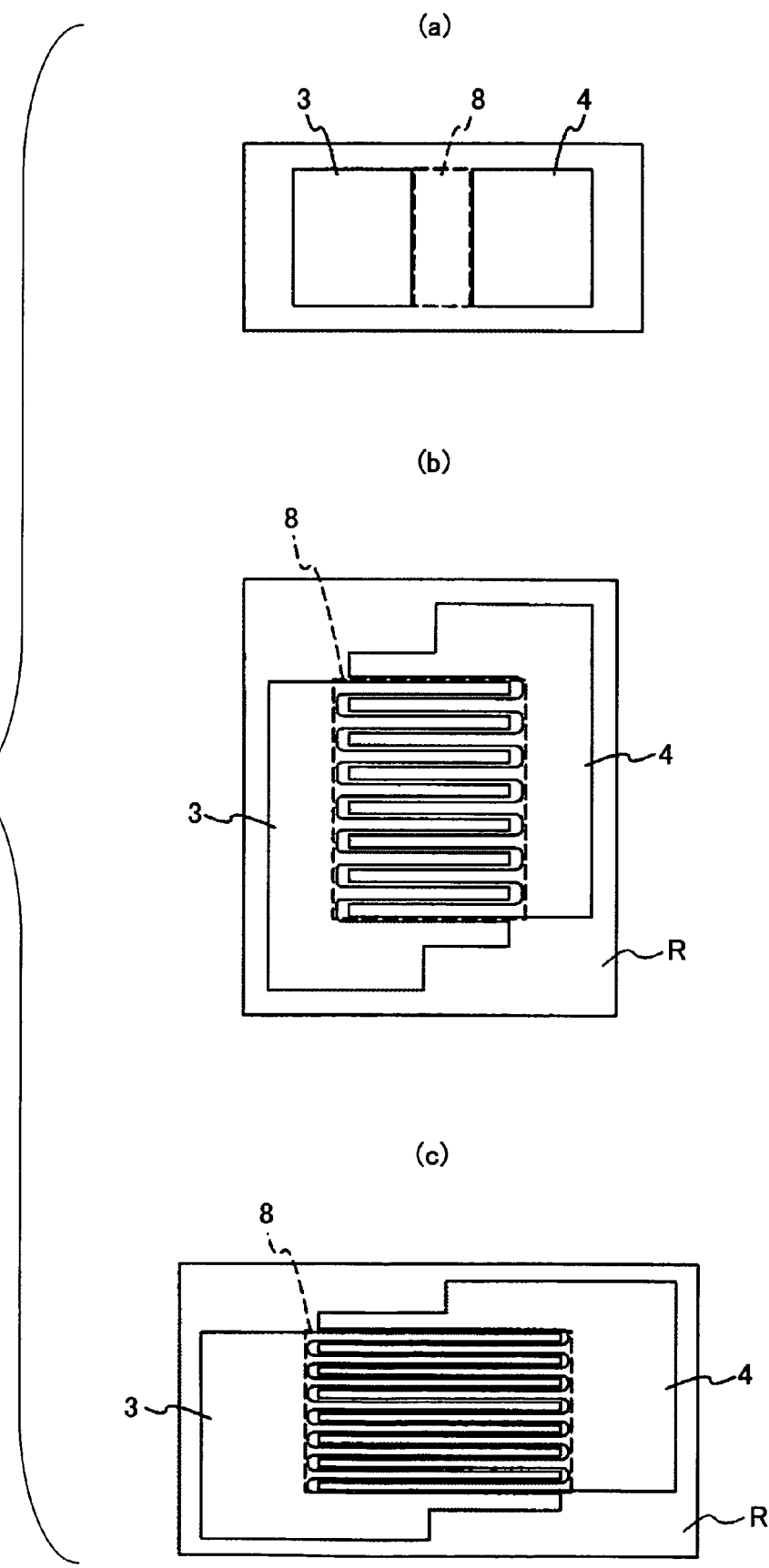
FIG. 22 illustrates shapes of a light emitting area of a light emitting type organic thin-film transistor device according to the present invention.

FIG. 22 shows examples thereof. FIG. 22(*a*) shows a light emission area of FIG. 17(*b*). An area defined by a bold broken line (inside) corresponds to the light emission area 8. The light emission area has an elongate shape (rectangular shape). FIG. 22(*b*) shows a light emission area of the embodiment of FIG. 18 by a bold broken line. In this case, a true light emission area 8 corresponds to an area of the organic semiconductor material layer which is exposed between the comb tooth shaped electrode patterns. However, the entirety of this area generally corresponds to an area 8 defined by the bold broken line, having an elongate (rectangular) shape. As a configuration for achieving the same elongate shape of a light emission area 8, as shown in FIG. 22(*c*), a length of comb teeth of the respective patterns of the source electrode 3 and the drain electrode 4 may be increased.

As can be seen from the above description, according to the present invention, in order to achieve more efficient light emission, a pattern configuration of the source electrode 3 and the drain electrode 4 are determined so that a light emission area has an elongate shape.

Further, by producing a plurality of the light emission areas in each of which the pair of electrodes 3 and 4 face one another, in a matrix manner, and also, shaping each of the plurality of light emission areas so that adjacent three areas form an approximately square of light emission area, transistor operation and light emission operation can be carried out in a single device, and thus, another useful, and new configuration of organic light emission type transistor can be provided, as will be described later.

Figure 23:
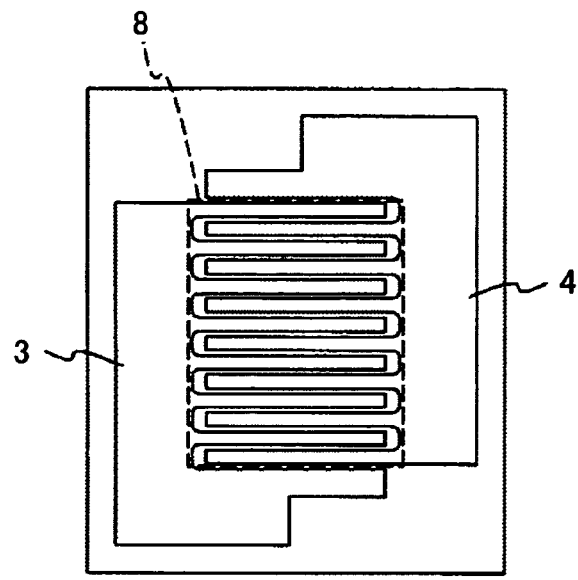
FIG. 23 corresponds to FIG. 22(b), and shows a light emitting area of a light emitting type organic thin-film transistor device according to the present invention.
Figure 24:
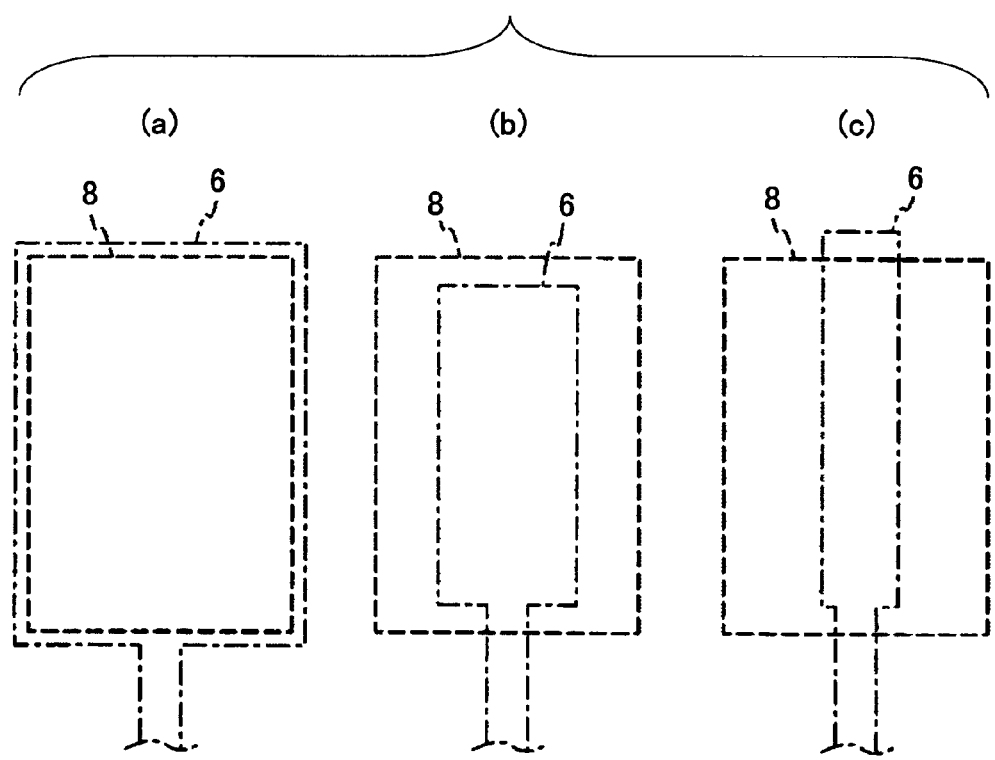
FIG. 24 illustrates a positional relationship, a size and so forth of the light emitting area and the gate electrode of a light emitting type organic thin-film transistor device according to the present invention.

Next, with reference to FIGS. 23 and 24, features of another embodiment of the present invention is described.

As described above, according to the present invention, light emitted may be taken out in a direction of the arrow B of FIG. 1, or may be taken out in a direction of the arrow A of FIG. 2. At this time, the gate insulating layer 5 and the gate electrode 6 are made of translucent material. Further, a pattern shape and a size of the gate electrode 6 should be appropriately determined.

FIG. 23 shows a configuration of a light emitting type organic transistor device having the same pattern as that of FIG. 22(*b*). In FIG. 23, an area (inside) defined by a bold broken line corresponds to a light emission area. The gate electrode 6 controlling light emission from the light emission area 8 is produced (in a case of FIG. 1) on the light emission area 8 through the gate insulating layer 5 made of translucent material, or, is produced (in a case of FIG. 2) under the light emission area 8 through the gate insulating layer 5 made of translucent material. In this case, a pattern of the gate electrode is produced in such a manner as to cover a wider area (defined by a thin chain line in FIG. 24(a)) than the light emission area 8 (inside of the bold broken line). That is, the gate electrode pattern is set to exist outer than an outer contour of the light emission area 8.

For example, if, as shown in FIG. 24(b) or (c), the gate electrode 6 has a pattern or position such that it cannot cover the entirety of the light emission area 8 (inside of the bold broken line), the outer contour (edge) of the pattern of the electrode 6 exists inside of the light emission area 8, problematically. The reason thereof is that, the pattern of the gate electrode 6 may be produced of translucent material such as ITO according to the present invention, and, although the ITO itself is transparent, a boundary of the pattern may be inevitably visible as a line if the pattern is produced so. Such a visible line may degrade a display quality when the light emitting type organic thin-film transistor device is applied to a display device.

Accordingly, in the present invention, as a configuration of the light emitting type organic thin-film transistor device, for a case where light is taken out through the gate electrode 6, the gate insulating layer 5 inserted therebetween should be made of translucent material, the gate electrode 6 pattern should be made of translucent material, and also, the gate electrode pattern should have a shape and/or size such as to cover an area wider than the area 8 from which the organic semiconductor material emits light.

The configuration examples of the light emitting type organic thin-film transistor device according to the present invention, and the examples of preferably usable materials have been thus described above. Next, a more specific usage example of the present invention is described. The present invention may be used as a light emitting device with the use of characteristics of the organic thin-film transistor providing light emission phenomena.

In the related art, when an organic transistor device is used as a display device, a device driving function is provided, in combination with a separately produced display device such as a liquid, an electrophoretic device, or an organic EL device.

Figure 25:
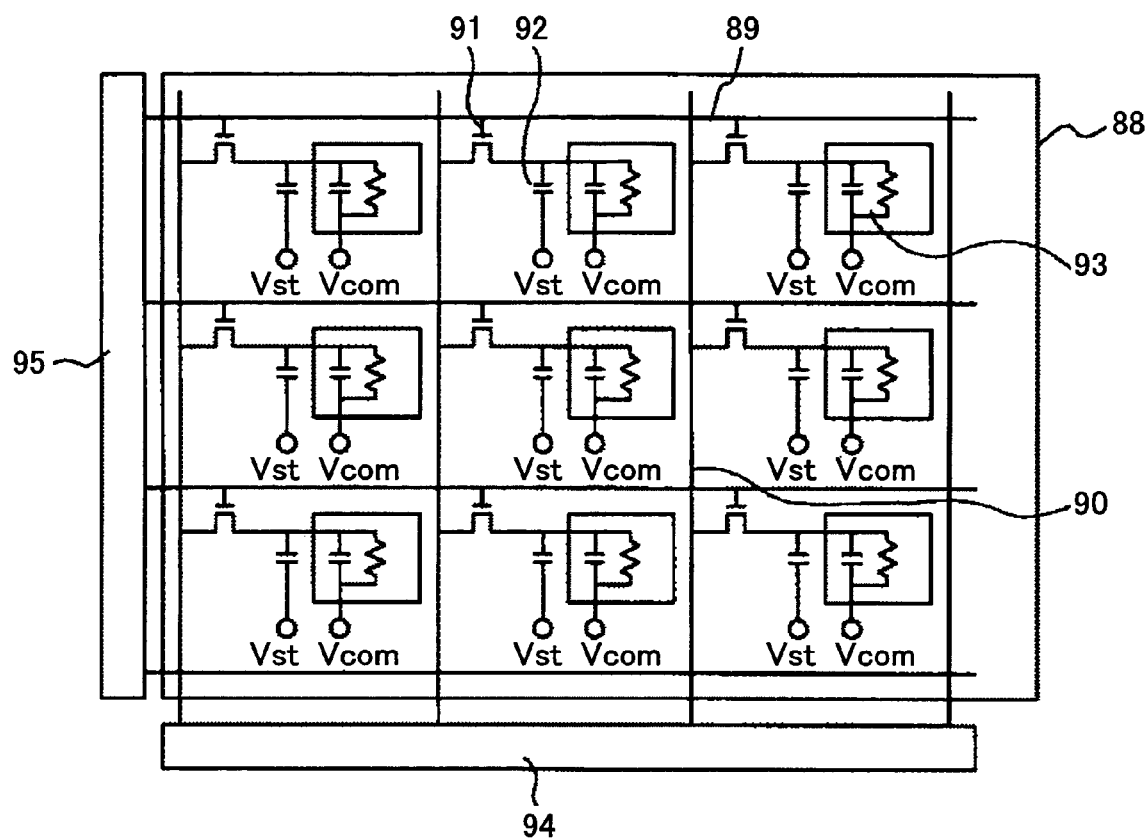
FIG. 25 shows one example of a general equivalent circuit of an organic transistor sheet (organic transistor unit) in which a plurality of organic transistor devices are arranged.

FIG. 25 shows a general equivalent circuit of an organic transistor sheet 88 in which a plurality of organic transistor devices are arranged in the related art. For the purpose of simplification of the figure, a 3 by 3 matrix arrangement is shown. However, actually, the organic transistor sheet 88 includes organic transistor devices 91 arranged in a matrix on the order of thousands by thousands through tens of thousands by tens of thousands. 89 denote gate bus lines of gate electrodes of the respective organic transistor devices 91. 90 denotes source bus lines of source electrodes of the respective organic transistor devices 91. To drain electrodes of the respective organic transistor devices 91, output devices 93 are connected. The output devices 93 are, for example, liquid crystal, electrophoretic devise or such, which act as pixels of the display device. In the example shown, liquid crystals as the output devices 93 are shown by equivalent circuits including resistances and capacitance. 92 denotes accumulating capacitors, 94 denotes vertical driving circuits and 95 denotes horizontal driving circuits.

In contrast thereto, according to the present invention, the organic transistor devices themselves may also act as light emitting devices (corresponding to the output devices 93). Accordingly, the above-mentioned output devices 93 such as liquid crystals, electrophoretic devices, or organic EL devices should not be separately provided. According to the present invention, as a result of the plurality of organic transistor devices being arranged in a matrix manner, and turning on/off of the organic transistor devices being carried out, they themselves can function as the output devices 93. Furthermore, in addition to a simple turning on/off control, a gate voltage may be gradually or stepwise changed. Thereby, a light emission amount can be controlled. As a result, they may be made to function also as the output devices 93 providing superior tone expression. That is, a very simple configuration of a self light emitting type display device, not requiring provision of the separate output devices 93 shown in FIG. 25, may be achieved. At this time, color filters of the light's three primary colors, R, G, B (red, green and blue), shaped to cover the respective light emission areas, are disposed respectively, at positions facing the light emission surfaces of the organic transistors. As a result, an absolutely new self light emitting type color display device in which transistor operation and light emission operation can be carried out in a single device, can be achieved as mentioned above.

Figure 29:
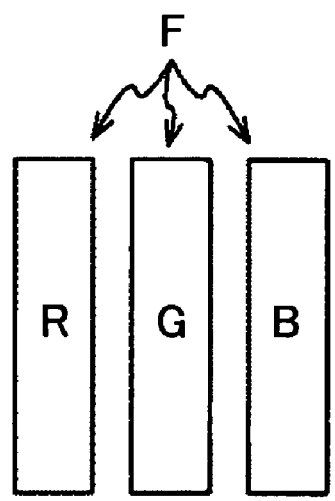
FIG. 29 shows one example of an arrangement of color filters of R, G, B (red, green and blue) arranged corresponding to the light emitting type organic thin-film transistor devices shown in FIG. 28.

At this time, R, G and B are included in one pixel. For this purpose, the light emission areas may be made to have elongate shape (rectangular shape), and the light emission areas of the organic transistor devices arranged in a matrix manner may be arranged in close proximity in a short dimension direction. As a result, each pixel (as a unit including the three colors RGB) can be prevented from having such a remarkably elongate shape as that of an aspect ratio amounting to 3, for example, but each pixel may have an approximately square shape from the three elongate color filters disposed side by side (see FIG. 29, for example). This is because the three organic transistor devices, each having the elongate shape, are arranged for one pixel. Thus, a self light emitting type color display device providing high grade display can be provided.

Figure 26:
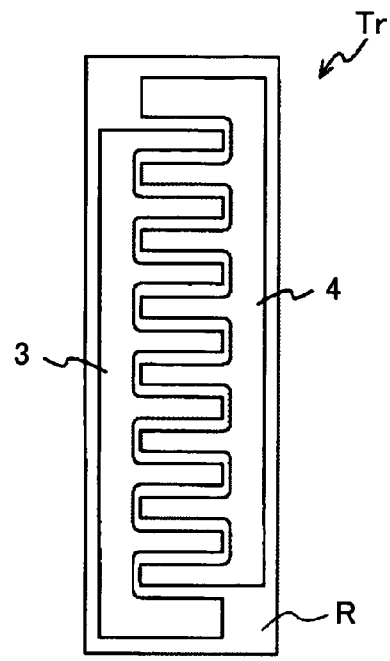
FIG. 26 shows one light emitting type organic thin-film transistor device according to the present invention.
Figure 27:
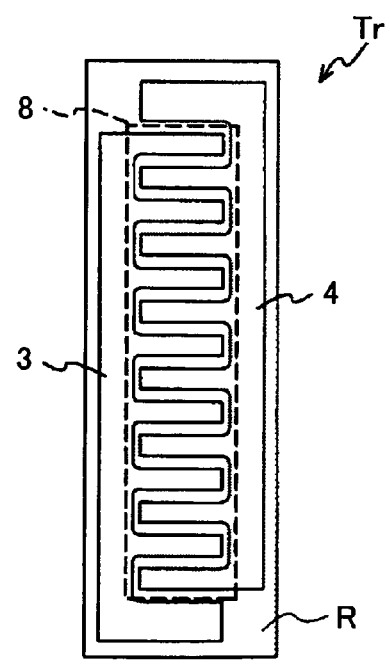
FIG. 27 shows a light emitting part of the light emitting type organic thin-film transistor device shown in FIG. 26.

This matter will now be described in more detail. FIG. 26 shows one of light emitting type organic thin-film transistor devices Tr which are preferably applied to the present invention, and is a variant example of FIG. 18. In FIG. 26, for the purpose of simplification of showing, only pattern configurations of the source electrode 3 and the drain electrode 4 are shown. FIG. 27 shows its light emitting part, where an area 8 corresponds to the light emission area which has an elongate (rectangular) shape.

Figure 28:
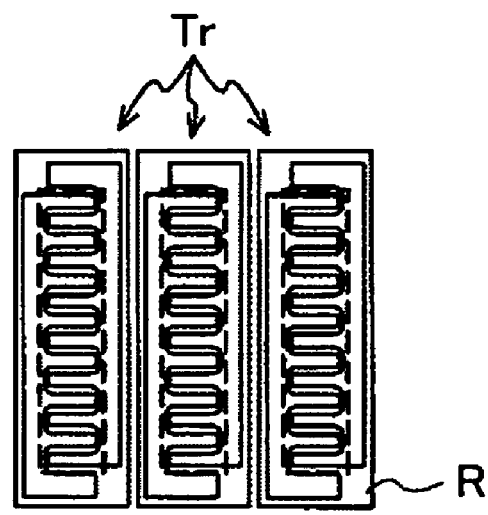
FIG. 28 shows a state in which three of light emitting type organic thin film transistor devices according to the present invention are arranged.
Figure 31:
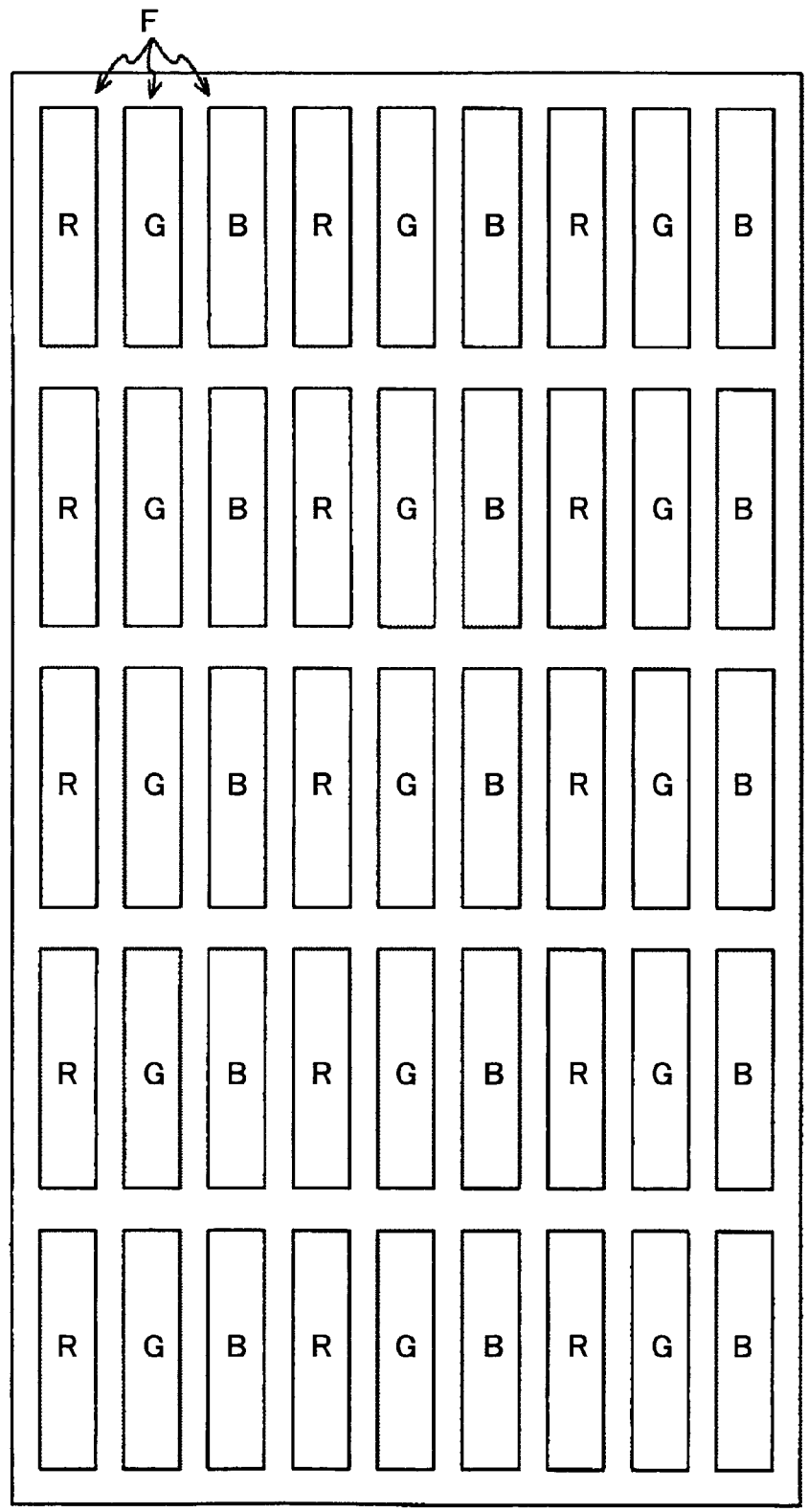
FIG. 31 shows one example, corresponding to the matrix arrangement of the light emitting type organic thin-film transistor devices shown of FIG. 30, in which R, G, B (red, green and blue) color filters are arranged.

FIG. 28 shows a state in which three of the light emitting type organic thin-film transistor devices Tr are arranged side by side. FIG. 31 shows an arrangement of R, G, and B color filters F disposed corresponding to the respective transistors. A size of a color filter of each color is set larger than the light emission area 8 of the light emitting type organic thin-film transistor device, and thus the color filter can completely cover the light emission area 8.

Figure 30:
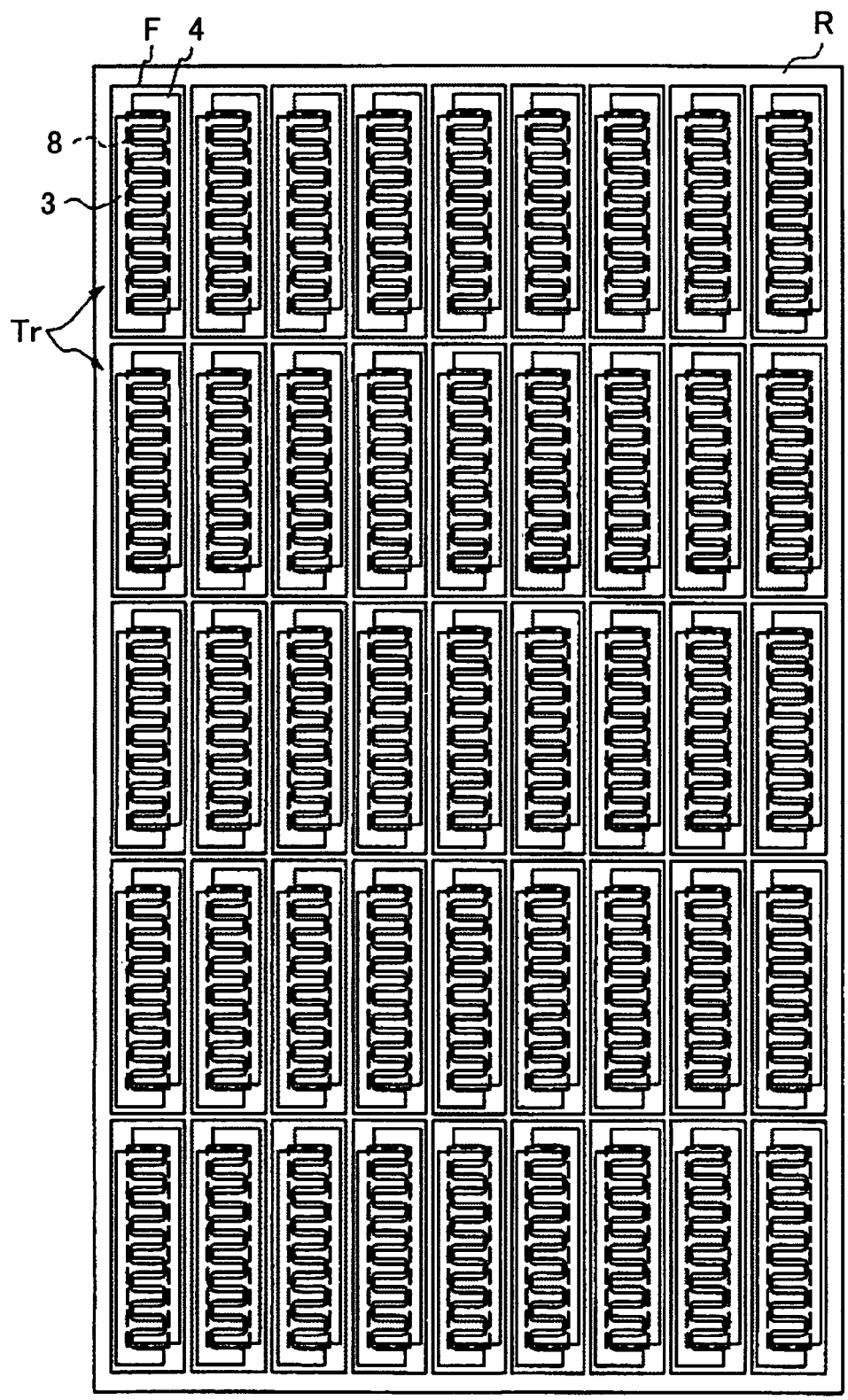
FIG. 30 shows one example in which light emitting type organic thin-film transistor devices according to the present invention are arranged in a matrix manner.
Figure 32:
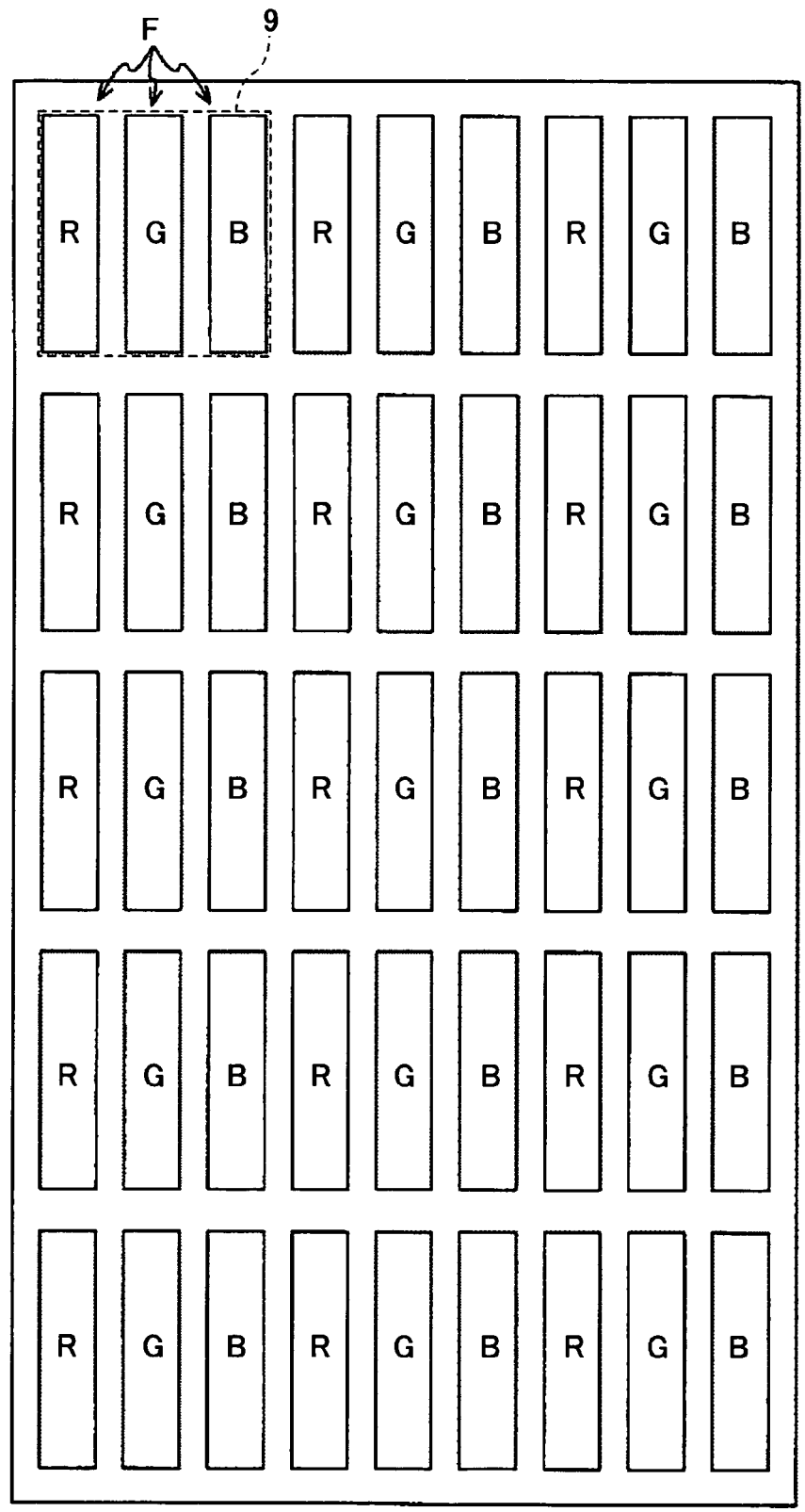
FIG. 32 shows an RGB group of color filters corresponding to one pixel.
Figure 33:
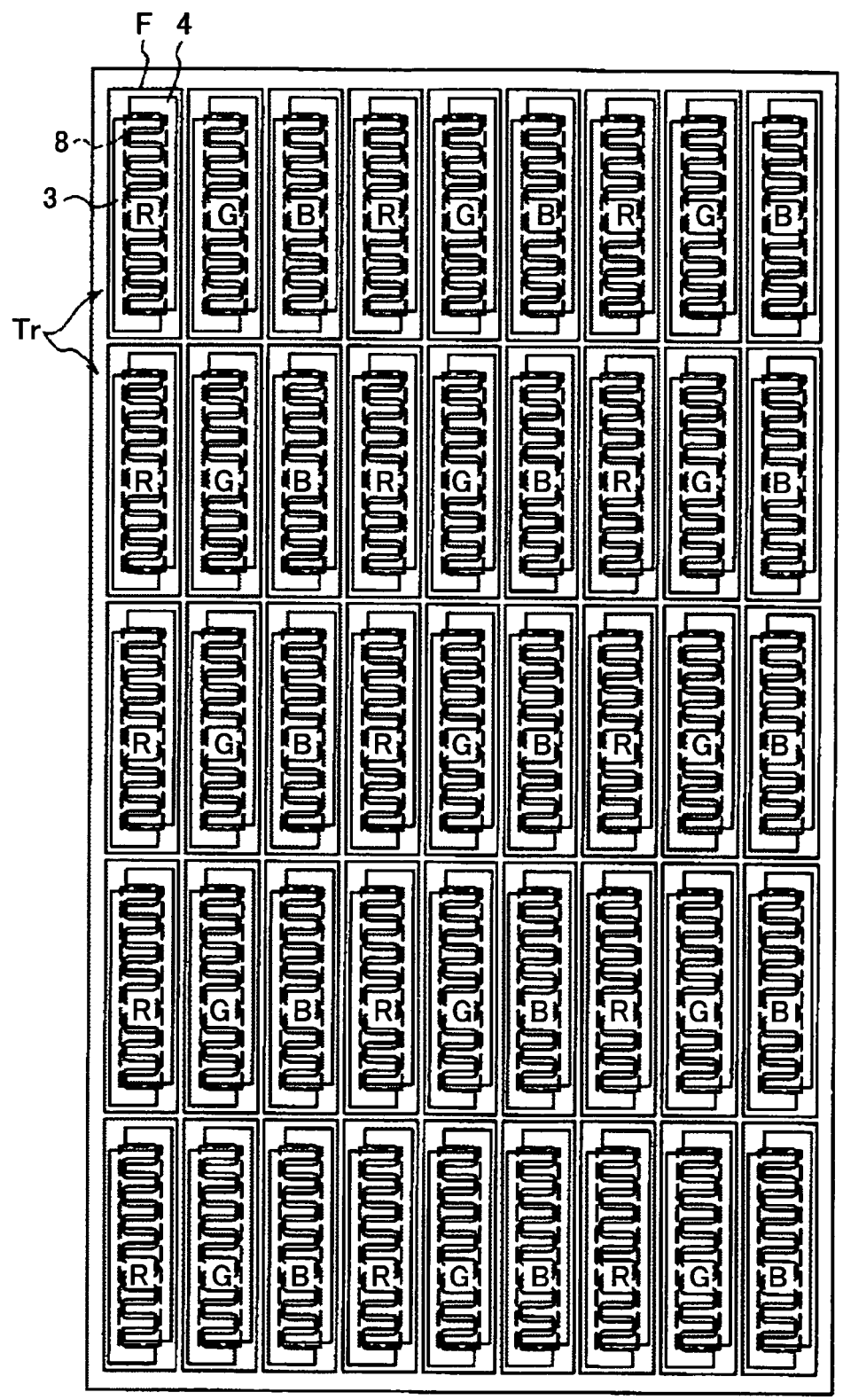
FIG. 33 shows an example in which a light emitting type organic thin-film transistor device substrate (sheet) (organic transistor unit) in which light emitting type organic thin-film transistor devices are arranged in a matrix manner and optical filters are disposed as mentioned above in such positions as to cover the above-mentioned light emitting surface.

FIG. 30 shows an example where the light emitting type organic thin-film transistor devices Tr are arranged in a manner of matrix. FIG. 31 shows an example of an arrangement of the R, G and B (red, green and blue) color filters F corresponding to the matrix arrangement of FIG. 30. In FIG. 32, one RGB group 9 from among the color filters of the R, G and B color filters F are shown by a bold broken line. These color filters are combined with the respective three light emitting type organic thin-film transistor devices arranged side by side, and thus, a pixel is obtained therefrom. FIG. 33 shows a configuration in which a light emitting type organic thin-film transistor device substrate (sheet) (organic transistor unit) in which the light emitting type organic thin-film transistor devices are produced in the matrix manner, and the above-mentioned optical filters F are arranged to face the above-mentioned light emitting surfaces and cover the respective light emission areas 8.

In this example, the light emission area 8 of one light emitting type organic thin-film transistor device has a shape of a rectangular in a size of 28 μm by 90 μm. Corresponding thereto, a size of the filter is 35 μm by 105 μm. One pixel emitting the three colors RGB has a shape of a squire of 120 μm by 120 μm. The display device thus has a function of carrying out color display of 200 ppi (picture element per inch, or pixel per inch). It is noted that one pixel should not strictly be a square, but should be an approximately squire (for example, an aspect ratio in a range between 0.8 and 1.2).

The color filters F may be produced as a result of material such as glass substrate, a plastic substrate or such being colored. However, by using a glass substrate as a base, as will be described later, it may be used also as a member for sealing in an airtight manner the light emission part with the use of its rigidity. On the other hand, when organic material such as plastic film is used, the light emitting type organic thin-film transistor device sheet itself may be produced of the same organic material film. As a result, a display device which has a reduced weight and may be bent, may be achieved. Actually, material should be selected in consideration of the respective advantages.

In the figure, merely the matrix of 5 pixel by 3 pixel (each pixel corresponding to the RGB light emission areas) is shown. However, when the light emitting type organic thin-film transistor devices are actually applied in a color display device, the number of pixels used are thousands of pixels by thousands of pixels through tens of thousands of pixel by tens of thousands of pixels. A display area has a size of hundreds of mm by hundreds of mm through thousands of mm by thousands of mm.

Other features of the present invention will now be described. As described above, the respective light emitting type organic thin-film transistor devices according to the present invention may be separately protected by material such as silicon oxide having transparency and sealing property. Thereby, sealing performance can be positively provided.

On the other hand, in consideration of costs. a method of coating the entire surface of all the organic transistors 88 shown in FIG. 27 by material of silicon oxide or such is a good method. Especially, for a case where of a display device in a size of 100 mm by 100 mm, it is preferable to seal all the organic transistor devices on the sheet in a lump, rather than carrying out sealing for the devices one by one separately.

Figure 34:
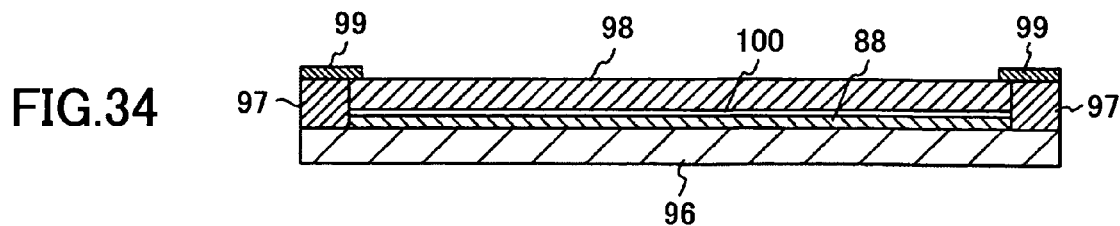
FIG. 34 shows an example of a configuration of a display device employing light emitting type organic transistor devices according to the present invention.

As another sealing method, the organic transistor sheet 88 itself shown in FIG. 27 may be held by a case, whereby a display device is obtained. FIG. 34 shows this example of configuration. In the figure, 88 denotes the organic transistor sheet (organic transistor unit), 96 denote a case bottom plate, 97 denote a case frame, 98 denote a protection substrate, 99 denote a sealing member and 100 denotes a gap.

Figure 35:
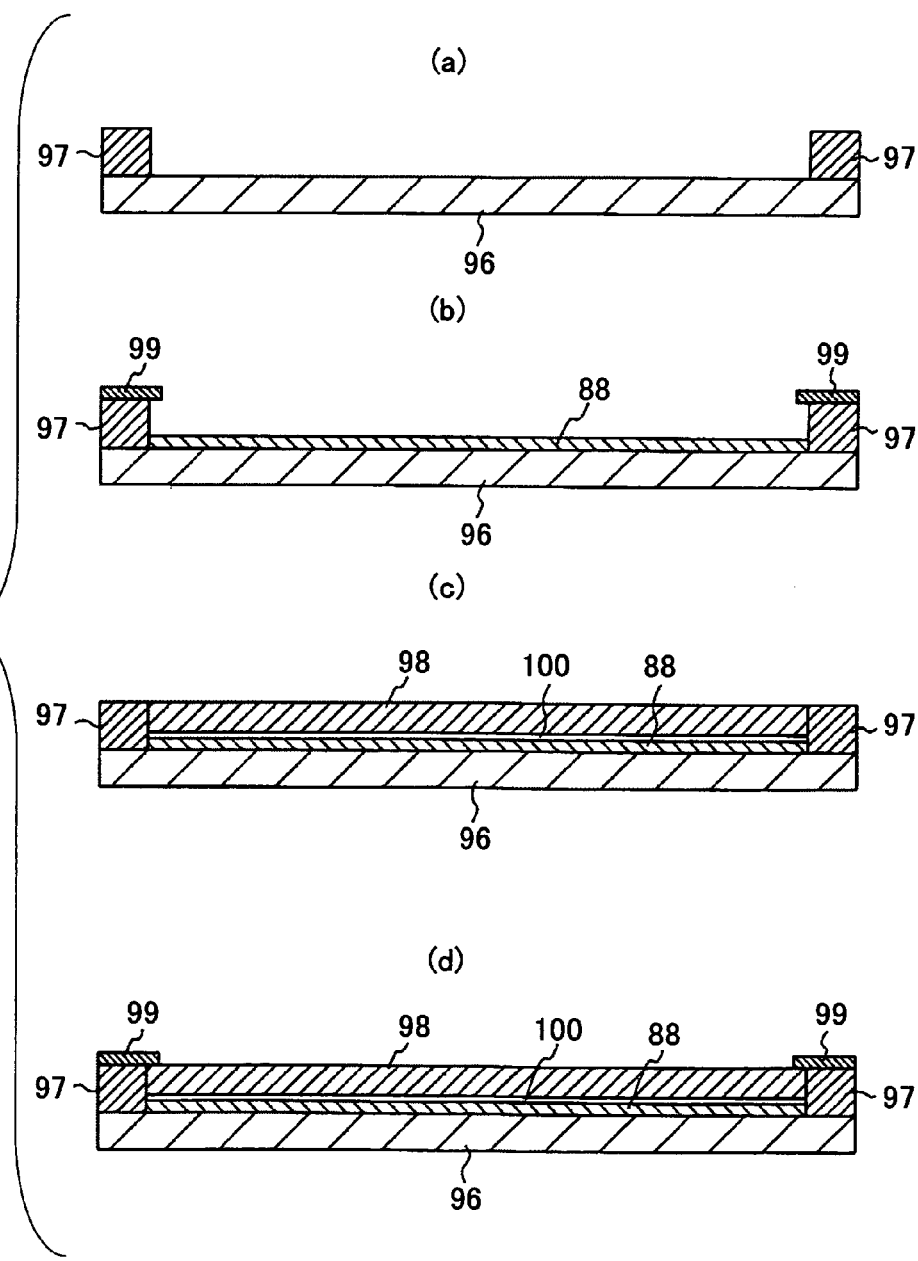
FIG. 35 illustrates an assembling method of the display device shown in FIG. 34.

Such a display device is assembled by the order shown in FIG. 35, (*a*) through (*d*). FIG. 35(*a*) shows a case made of the case bottom plate 96 and the case frame 97, which hold the organic transistor sheet 88. As shown in FIG. 35(*b*), the organic transistor sheet 88, on a surface of which organic transistor devices (not shown) are arranged in a matrix manner on the order of thousands by thousands through tens of thousands by tens of thousands, is held in the case. Further, as shown in FIG. 35(*c*), the protection substrate 98 is put on the thus-produced organic transistor device surfaces in close proximity. Then, finally, as shown in FIG. 35(*d*), the case is sealed by the sealing member 99. At this time, the gap 100 exists between the organic transistor sheet 88 and the projection substrate 98. This gap is kept in a vacuum airtight state of $1\times10^{-1}$ through $1\times10^{-8}$ Torrs, for the purpose of allowing the transistor devices to emit light. More preferably, in order to improve the light emission efficiency and keeping a stable light emission state, a vacuum of $1\times10^{-3}$ through $1\times10^{-8}$ Torrs may be kept. Further, the smaller gap distance is more preferable, and, at the largest, the gap distance should be not more than the thickness of the protection substrate 98. This is because, since the gap is kept in the vacuum state, the protection substrate 98 may be deformed by the atmosphere pressure. In the worst case, it may be broken. In order to avoid such a situation, the gap should be not more than the thickness of the protection substrate 98. Specifically, the thickness of the protection substrate 98 should be 0.5 through 10 mm, and, when the gap distance is smaller than this value, the protection substrate 98 can be prevented from being broken even when the gap is in the vacuum state. More preferably, the gap should be almost zero. That is, a good method is to make the organic transistor sheet 88 and the protection substrate 98 in a contact state.

As material of the protection substrate 98, a translucent member is selected for the purpose of taking emitted light externally therethrough. Pyrex (registered trademark) made by Corning Co., Ltd., or such, may be preferably used therefor. Alternatively, in consideration of crash proof property, chemical strengthen glass FL3.2 made by Nippon Sheet Glass Co., Ltd., or such, may be preferably used.

As another preferable configuration, inactive gas such as nitrogen gas may be injected in the gap 100 between the organic transistor sheet 88 and the protection substrate 98, and then, a sealed state may be provided. Thereby, high light emission efficiency can be obtained.

The above-mentioned color filters may be then disposed on the protection substrate 98 or between the organic transistor sheet 88 and the projection substrate 98. Alternatively, the color filters themselves may be produced in a glass substrate and may also be used as the protection substrate 98.

When the gate voltage was changed with −90 V of the drain voltage in a condition of the above-described light emitting type organic thin-film transistor device (without the device protection layer 7) according to the present invention shown in FIGS. 15 and 16 in the vacuum airtight state of $1\times10^{-2}$ Torrs as mentioned above, actual light emission started upon −60 V, then, brightness of approximately 1000 cd/m$^2$ was obtained upon −70 V, and brightness of approximately 1300 cd/m$^2$ was obtained upon −80 V. Thus, brightness could be changed continuously according to a change of the gate voltage. The maximum brightness of approximately 1600 cd/m$^2$ was obtained upon −90 V.

In a vacuum state of $1\times10^{-3}$ Torrs, the maximum brightness of approximately 2000 cd/m$^2$ was obtained with the drain voltage of −90 V and the gate voltage of −90 V. Further, in a vacuum state of $1\times10^{-7}$ Torrs, the maximum brightness of approximately 2500 cd/m$^2$ was obtained with the drain voltage of −90 V and the gate voltage of −90 V. Further, also in a nitrogen gas injected state instead of such a vacuum airtight state, the maximum brightness of approximately 2400 cd/m$^2$ was obtained with the drain voltage of −90 V and the gate voltage of −90 V. Next, the device projection layer 7 (silicon oxide) was provided on the entire surface of the light emitting type organic thin-film transistor device with a thickness of 0.5 μm and the device was thus sealed. Then, evaluation was made in the ordinary air. As a result, the maximum brightness of approximately 2200 cd/m$^2$ was obtained with the drain voltage of −90 V and the gate voltage of −90 V. Therefrom, it was seen that the device could function even in the air when sealing was properly made.

Further, the present invention is not limited to the above-described embodiments, and variations and modifications may be made without departing from the basic concept of the present invention claimed below.

The present application is based on Japanese Priority Applications Nos. 2005-063197, 2005-063198, 2005-063199, 2005-063200 and 2005-063201, each filed on Mar. 7, 2005, the entire contents of which are hereby incorporated herein by reference.

What is claimed is:

1. A display device comprising:
an organic transistor substrate, in which a plurality of organic transistors are arranged, wherein
the organic transistors include,
a substrate,
a pair of electrodes comprising a first electrode and a second electrode,
an organic semiconductor layer provided between said first and second electrodes, and
a third electrode, through an insulating layer, in an area in which said organic semiconductor layer is provided between said pair of electrodes, wherein
a configuration is made such that a voltage applied between said pair of electrodes causes said organic semiconductor layer to emit light and a voltage applied to said third electrode controls the light emission of the organic semiconductor layer, and
said substrate is made of translucent material so that light emitted by the organic semiconductor layer can be taken out from a side of said substrate; and
light emission of the organic transistors of said organic transistor unit is configured to be turned on/off.

2. The display device of claim 1, wherein the organic transistor substrate is disposed in a vacuum airtight state.

3. The display device of claim 1, wherein the organic transistor substrate is disposed in an inert gas atmosphere.

4. A display device comprising:
an organic transistor substrate, in which a plurality of the organic transistors are arranged, wherein
the organic transistors include,
an electrode layer, an insulating layer and an organic semiconductor layer disposed on a substrate in this order,
a pair of electrodes disposed to be electrically conductive to said organic semiconductor layer, wherein a configuration is further made such that said organic semiconductor layer is sealed, a voltage applied between said pair of electrodes causes said organic semiconductor layer to emit light, and a voltage applied to said electrode controls the light emission, and
said substrate, said electrode layer and said insulating layer are made of translucent material, so that light emitted by said semiconductor layer can be taken out from a side of said substrate; and
light emission of the organic transistors of said organic transistor unit is configured to be turned on/off.

5. The display device of claim 4, wherein the organic transistor substrate is disposed in a vacuum airtight state.

6. The display device of claim 4, wherein the organic transistor substrate is disposed in an inert gas atmosphere.

7. A display device comprising:
a light emitting substrate in which a plurality of organic transistors are arranged on a substrate, each of said plurality of organic transistors includes,
a pair of electrodes including a first electrode and a second electrode,
an organic semiconductor layer provided between said pair of electrodes, and
a third electrode provided on the organic semiconductor layer via an insulating layer, wherein
a voltage applied between said pair of electrodes causes said organic semiconductor layer to emit light, and
a voltage applied to said third electrode controls the light emission; and
an optical filter at a position such as to face a light emitting surface of said light-emitting substrate, wherein
said pair of electrodes is configured such that an area from which said organic semiconductor layer emits light has an elongated shape,
said optical filter has a corresponding elongated shape, and said light-emitting substrate and the filter are laminated.

8. The display device as claimed in claim 7, wherein
three of the elongated light emitting areas are arranged side by side so that an approximately square light emitting area is obtained,
correspondingly, three of the optical filters are arranged side by side so that an approximately square shape is obtained, and
the optical filters comprise those for three colors, and also, a filter area for the three colors forms an approximately square area.

9. The display device as claimed in claim 7, wherein
three elongated light emitting areas are arranged side by side so that an approximately square light emitting area is obtained,
correspondingly, three optical filters are arranged side by side so that an approximately square shape is obtained, and
the optical filters include those for three colors, and also, a filter area for the three colors forms an approximately square area.

10. The display device according to claim 7, wherein the laminated light-emitting substrate and the laminated filter are disposed in a vacuum airtight state.

11. The display device according to claim 7, wherein the laminated light-emitting substrate and the laminated filter are disposed in an inert gas atmosphere.

12. The display device according to claim 7, wherein an area from which said organic semiconductor layer emits light is disposed in a vacuum airtight state.

13. The display device according to claim 7, wherein an area from which said organic semiconductor layer emits light is disposed in an inert gas atmosphere.

* * * * *